United States Patent
Matsumoto

(10) Patent No.: US 10,535,779 B2
(45) Date of Patent: Jan. 14, 2020

(54) THIN FILM TRANSISTOR AND METHOD FOR MANUFACTURING THIN FILM TRANSISTOR

(71) Applicant: JOLED INC., Tokyo (JP)

(72) Inventor: Mitsutaka Matsumoto, Kyoto (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 15/872,879

(22) Filed: Jan. 16, 2018

(65) Prior Publication Data
US 2018/0158954 A1 Jun. 7, 2018

Related U.S. Application Data

(63) Continuation of application No. PCT/JP2015/003610, filed on Jul. 17, 2015.

(51) Int. Cl.
| | |
|---|---|
| *H01L 29/786* | (2006.01) |
| *H01L 21/385* | (2006.01) |
| *H01L 21/44* | (2006.01) |
| *H01L 21/4757* | (2006.01) |
| *H01L 29/26* | (2006.01) |
| *H01L 29/49* | (2006.01) |
| *H01L 29/66* | (2006.01) |

(52) U.S. Cl.
CPC ........ *H01L 29/7869* (2013.01); *H01L 21/385* (2013.01); *H01L 21/44* (2013.01); *H01L 21/47576* (2013.01); *H01L 29/26* (2013.01); *H01L 29/4908* (2013.01); *H01L 29/66969* (2013.01)

(58) Field of Classification Search
CPC . H01L 29/7869; H01L 29/4908; B82Y 10/00; B82Y 30/00
USPC .................................. 257/40, 43, E21.264
See application file for complete search history.

(56) References Cited

U.S. PATENT DOCUMENTS 7,202,495 B2 * 4/2007 Unno .................. H01L 51/0012
257/40
8,288,765 B2 * 10/2012 Inoue .................... H01L 51/052
257/40
(Continued)

FOREIGN PATENT DOCUMENTS

| JP | 2007-220817 A | 8/2007 |
| JP | 2010-161227 A | 7/2010 |

(Continued)

OTHER PUBLICATIONS

International Search Report in PCT/JP2015/003610, dated Oct. 6, 2015, 6pp.
(Continued)

*Primary Examiner* — Jonathan Han
(74) *Attorney, Agent, or Firm* — Hauptman Ham, LLP

(57) ABSTRACT

A thin film transistor includes a gate electrode. The thin film transistor further includes an oxide semiconductor layer which includes at least indium and is usable as a channel layer, wherein a region of the oxide semiconductor layer closest to the gate electrode includes fluorine. The thin film transistor further includes a gate insulating layer between the gate electrode and the oxide semiconductor layer. The thin film transistor further includes a fluorine-including layer which includes fluorine and is between the gate electrode and the gate insulating layer.

17 Claims, 11 Drawing Sheets

(56) References Cited

U.S. PATENT DOCUMENTS

| | | | |
|---|---|---|---|
| 2006/0151781 A1* | 7/2006 | Kim | H01L 21/0212 257/40 |
| 2011/0140116 A1* | 6/2011 | Morosawa | H01L 29/4908 257/59 |
| 2011/0240998 A1 | 10/2011 | Morosawa et al. | |
| 2012/0228604 A1* | 9/2012 | Choi | H01L 27/1225 257/43 |
| 2013/0037798 A1* | 2/2013 | Wong | H01L 29/7869 257/43 |
| 2013/0256673 A1* | 10/2013 | Nishiyama | H01L 29/78606 257/59 |
| 2015/0053970 A1* | 2/2015 | Lee | H01L 27/1225 257/43 |
| 2015/0060990 A1* | 3/2015 | Kim | H01L 29/7869 257/324 |
| 2015/0079727 A1* | 3/2015 | Lee | H01L 29/4908 438/104 |

FOREIGN PATENT DOCUMENTS

| | | |
|---|---|---|
| JP | 2011-119355 A | 6/2011 |
| JP | 2011-228622 A | 11/2011 |

OTHER PUBLICATIONS

Jaechul Park et al., "Self-aligned top-gate amorphous gallium indium zinc oxide thin film transistors", Applied Physics Letters, American Institute of Physics, 93, 053501, 2008, 3pp.

Hideyuki Omura et al.,"First-principles study of native point defects in crystalline indium gallium zinc oxide", Journal of Applied Physics. 105, 093712, 2009, 8pp.

* cited by examiner

THIN FILM TRANSISTOR AND METHOD FOR MANUFACTURING THIN FILM TRANSISTOR

CROSS-REFERENCE TO RELATED APPLICATIONS

The present application is a continuation of International Application No. PCT/JP2015/003610 filed Jul. 17, 2015 which designates the United States, incorporated herein by reference.

TECHNICAL FIELD

The present description relates to a thin film transistor (TFT) and a method for manufacturing the thin film transistor, and in particular to an oxide semiconductor thin film transistor having an oxide semiconductor layer, and a method for manufacturing the oxide semiconductor thin film transistor.

BACKGROUND ART

Active matrix display devices such as liquid crystal display devices and organic electroluminescent (EL) display devices use TFTs as switching elements or driver elements.

In recent years, active development has been conducted on, as next-generation TFTs, oxide semiconductor TFTs which use an oxide semiconductor such as InGaZnO$_x$ (IGZO) for channel layers. For example, Patent Literature (PTL) 1 describes an oxide semiconductor TFT having an oxide semiconductor layer as a channel layer.

CITATION LIST

Patent Literature

[PTL 1]
Japanese Unexamined Patent Application Publication No. 2010-161227
[PTL 2]
Japanese Unexamined Patent Application Publication No. 2007-220817

Non Patent Literature

[NPL 1]
J. Park, et. al., "Self-aligned top-gate amorphous gallium indium zinc oxide thin film transistors," Applied Physics Letters, American Institute of Physics, 93, 053501 (2008)
[NPL 2]
Hideyuki Omura, et. al., "First-principles study of native point defects in crystalline indium gallium zinc oxide," J. Appl. Phys. 105, 093712, 2009

SUMMARY

Producing an oxide semiconductor TFT having high reliability is difficult.

The present description helps to provide a thin film transistor having high reliability and a method for manufacturing the thin film transistor.

In order to provide a thin film transistor (TFT) having high reliability, a thin film transistor according to one aspect of the present description includes a gate electrode. The TFT further includes an oxide semiconductor layer which includes at least indium and is usable as a channel layer. The TFT further includes a gate insulating layer disposed between the gate electrode and the oxide semiconductor layer. The TFT further includes a fluorine-including layer which includes fluorine and is disposed between the gate electrode and the gate insulating layer. Fluorine is included in a region in the oxide semiconductor layer and close to the gate insulating layer.

A thin film transistor having the above structure exhibits high reliability.

DETAILED DESCRIPTION

Figure 1:
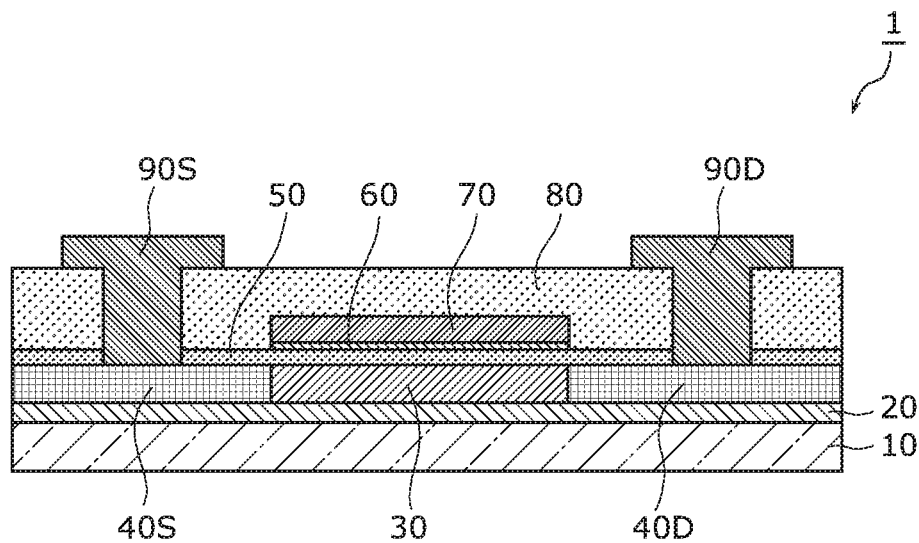
FIG. 1 is a cross-sectional view of a structure of a thin film transistor according to at least one embodiment.

A thin film transistor (TFT) according to at least one aspect of the present description includes a gate electrode. The TFT includes an oxide semiconductor layer which includes at least indium and is usable as a channel layer. The TFT includes a gate insulating layer disposed between the gate electrode and the oxide semiconductor layer. The TFT includes a fluorine-including layer which includes fluorine and is disposed between the gate electrode and the gate insulating layer. Fluorine is included in a region in the oxide semiconductor layer and close to the gate insulating layer.

According to at least one aspect of the present description, fluorine is included in the region in the oxide semiconductor layer and close to the gate insulating layer.

Fluorine has higher binding energy with metal than oxygen. Accordingly, including fluorine in the oxide semiconductor layer enables fluorine to help eliminate dangling bonds or an unstable site caused by oxygen deficiency in the oxide semiconductor layer. In other words, including fluorine in the oxide semiconductor layer makes helps to compensate for the oxygen deficiency in the oxide semiconductor layer.

Moreover, including fluorine in the oxide semiconductor layer helps to prevent hydrogen entering the oxide semiconductor layer from bonding with the oxide semiconductor layer. With this, hydrogen is inhibited from entering the oxide semiconductor layer, thereby suppressing generation of charge carriers resulting from bonding of oxygen and hydrogen in the oxide semiconductor layer. In short, including fluorine in the oxide semiconductor layer helps to improve hydrogen resistance of the oxide semiconductor layer.

Furthermore, including fluorine in the oxide semiconductor layer results in metallic elements included in the oxide semiconductor layer being chemically bonded with fluorine, which helps to stabilize a structure of the oxide semiconductor layer.

As just described, according to at least one aspect of the present description, the oxide semiconductor layer is less susceptible to damage resulting hydrogen or oxygen as well as stabilize the structure of the oxide semiconductor layer. With this, a thin film transistor having high reliability and high robustness is possible.

Moreover, according to at least one aspect of the present description, the fluorine-including layer is disposed between the gate electrode and the gate insulating layer.

With this, a threshold voltage (Vth) of the thin film transistor is shifted to the positive side. Accordingly, the thin film transistor has superior device characteristics.

Moreover, in the thin film transistor according to at least one aspect of the present description, the gate insulating layer includes fluorine, and a fluorine concentration of the oxide semiconductor layer is higher than a fluorine concentration of the gate insulating layer.

According to at least one aspect of the present description, hydrogen entering the oxide semiconductor layer can be blocked by the oxide semiconductor layer.

Moreover, in the thin film transistor according to at least one aspect of the present description, the fluorine-including layer may be a fluorine layer including only fluorine.

According to at least one aspect of the present description, the fluorine-including layer is formed on the gate insulating layer by supply of fluorine system gas.

Moreover, in the thin film transistor according to at least one aspect of the present description, the gate insulating layer may include an inorganic material, and the fluorine-including layer may be an organic layer which includes fluorine and includes an organic material.

According to at least one aspect of the present description, the fluorine-including layer can be made of the organic layer including fluorine. With this, because the fluorine-including layer is physically adsorbed to the organic layer, fluorine is easily supplied to the oxide semiconductor layer from the fluorine-including layer.

Moreover, in the thin film transistor according to at least one aspect of the present description, the fluorine-including layer and the gate insulating layer may include a same main element, and a peak position of an X-ray photoelectron spectroscopy spectrum of the main element in the fluorine-including layer may be closer to a high binding energy side than a peak position of an X-ray photoelectron spectroscopy spectrum of the main element in the gate insulating layer is.

According to at least one aspect of the present description, fluorine in the fluorine-including layer is more chemically boned with the main element than fluorine in the gate insulating layer is.

Moreover, in the thin film transistor according to at least one aspect of the present description, in the oxide semiconductor layer, a fluorine concentration of a region close to the gate insulating layer may be higher than a fluorine concentration of a region far from the gate insulating layer.

According to at least one aspect of the present description, a portion of the region that is in the oxide semiconductor layer and close to the gate insulating layer (fluorine-including layer) is an oxygen deficient region, and only this region is compensated with fluorine. As a result, because an amount of fluorine is reduced, a high carrier density is maintained. Accordingly, the thin film transistor has superior ON characteristics.

Moreover, a method for manufacturing a thin film transistor according to at least one aspect of the present description includes forming an oxide semiconductor film including indium, above a substrate. The method further includes forming a gate insulating layer above the oxide semiconductor film. The method further includes forming a fluorine-including layer above the gate insulating layer. The method further includes forming a gate electrode above the fluorine-including layer. The method further includes annealing, after the fluorine-including layer is formed, the fluorine-including layer to diffuse fluorine from the fluorine-including layer into the oxide semiconductor film.

According to at least one aspect of the present description, oxygen deficiency in the oxide semiconductor film can be compensated with fluorine by diffusing fluorine from the fluorine-including layer into the oxide semiconductor film. This forms an oxide semiconductor layer which includes fluorine and in which the oxygen deficiency in the oxide semiconductor film is compensated for with the fluorine. As a result, the oxide semiconductor layer has superior hydrogen resistance as well as a stable structure. Accordingly, a thin film transistor having high reliability and high robustness is possible.

Moreover, in the method for manufacturing a thin film transistor according to at least one aspect of the present description, in the forming of the gate insulating layer, the gate insulating layer which includes an element as a main component may be deposited on the oxide semiconductor film by supplying reactive gas containing molecules including an alkyl group and the element included in the gate insulating layer.

According to at least one aspect of the present description, because the oxygen deficiency in a surface layer of the oxide semiconductor film is caused by oxygen being desorbed from the surface layer of the oxide semiconductor film by carbon of the alkyl group in the forming of the gate insulating layer, the oxide semiconductor film is in a low resistance state. In other words, low resistance regions (a source region and a drain region) are formed in the oxide semiconductor film without using plasma or hydrogen.

Moreover, in the method for manufacturing a thin film transistor according to at least one one aspect of the present description, the fluorine-including layer may be formed above a portion of the oxide semiconductor film, and in the annealing, fluorine may be diffused into the portion of the oxide semiconductor film and bonded with the oxide semiconductor film, the portion being covered with the fluorine-including layer and included in a region of the oxide semiconductor film from which the reactive gas supplied when the gate insulating layer is deposited desorbs oxygen.

According to at least one aspect of the present description, fluorine is diffused into the portion of the oxide semiconductor covered with the fluorine-including layer, whereas fluorine is not diffused into portions of the oxide semiconductor film not covered with the fluorine-including layer. In consequence, in the region (oxygen deficiency region) of the oxide semiconductor film from which oxygen is desorbed, the portion covered with the fluorine-including layer is compensated with fluorine, and the portions not covered with the fluorine-including layer are not compensated with fluorine and are kept in a low resistance state.

Accordingly, by using the portion of the oxide semiconductor film compensated with fluorine as the channel region, and by using the portions of the oxide semiconductor film not compensated with fluorine as the source region and the drain region, a thin film transistor has the source region and the drain region on the respective sides of the channel region. In addition, the source region and the drain region are formed in a self-aligning manner.

The following describes at least one embodiment of the present description with reference to the accompanying drawings. The at least one embodiment described below is merely an example of the present description. Values, shapes, materials, components, arrangement and connection of the components, processes (steps), order of the processes, and the like shown in the following embodiment are merely exemplary and are not intended to limit the present description. Therefore, among the components of the at least one embodiment below, components not recited in any one of independent claims are described as arbitrary components.

The figures are schematic views and do not necessarily limit the present description to that precisely shown. In the figures, the same reference sign is used to refer to substantially the same component, and description already set forth is may be omitted or simplified.

[Structure of Thin Film Transistor]

First, the following describes a thin film transistor 1 according to at least one embodiment of the present description with reference to FIG. 1. FIG. 1 is a cross-sectional view of a structure of a thin film transistor according to at least one embodiment of the present description.

In FIG. 1, the thin film transistor 1 according to at least one embodiment is a top gate oxide semiconductor TFT having an oxide semiconductor layer as a channel layer.

The thin film transistor 1 includes: a substrate 10; an undercoat layer 20; an oxide semiconductor layer 30 usable as a channel layer; an oxide semiconductor layer 40S usable as a source region; an oxide semiconductor layer 40D usable as a drain region; a gate insulating layer 50; a fluorine-including layer 60; a gate electrode 70; an interlayer insulating layer 80; and a source electrode 90S and a drain electrode 90D.

The following describes in detail each component of the thin film transistor 1 according to at least one embodiment.

The substrate 10 is a glass substrate including a glass material such as quartz glass, alkali-free glass, and high heat-resistant glass. The substrate 10 is not limited to the glass substrate and may be a resin substrate or the like. Moreover, the substrate 10 is not a rigid substrate but may be a flexible substrate including a single layer of a film material such as polyimide, polyethylene terephthalate, and polyethylene naphthalate, or stacked layers of these.

The undercoat layer 20 is formed on the substrate 10. The undercoat layer 20 is formed to help prevent impurities such as sodium and phosphorus included in the substrate 10 (glass substrate) or moisture permeated from the air from entering the oxide semiconductor layers 30, 40S, and 40D.

The undercoat layer 20 is a single layer insulating layer of an oxide insulating layer or a nitride insulating layer, or a stacked insulating layer including an oxide insulating layer and a nitride insulating layer. In at least one instance, a single layer film of silicon nitride ($SiN_x$), silicon oxide ($SiO_y$), silicon oxynitride ($SiO_yN_x$), or aluminum oxide ($AlO_x$), or stacked films of these can be used as the undercoat layer 20. The film thickness of the undercoat layer 20 is set to be from 100 to 500 nm. In at least one embodiment, undercoat layer 20 is omitted.

The oxide semiconductor layer 30 is usable as a channel layer. In other words, the oxide semiconductor layer 30 is a semiconductor layer including a channel region opposing the gate electrode 70 with the gate insulating layer 50 being between the channel region and the gate electrode 70. In at least one embodiment, the oxide semiconductor layer 30 is formed at a position opposite the gate electrode 70 with the gate insulating layer 50 and the fluorine-including layer 60 being between the oxide semiconductor layer 30 and the gate electrode 70.

By contrast, the oxide semiconductor layer 40S is a semiconductor layer usable as a source region provided on one side of the oxide semiconductor layer 30. Moreover, the oxide semiconductor layer 40D is a semiconductor layer usable as a drain region provided on the other side of the oxide semiconductor layer 30. The oxide semiconductor layers 40S and 40D each are a low resistance region (offset region) having a resistance value lower than that of the oxide semiconductor layer 30.

Moreover, in each of the oxide semiconductor layers 40S and 40D, a resistance value of an upper region (region closer to a side of the interlayer insulating layer 80) is less than that of a lower region (region closer to a side of the undercoat layer 20). Stated differently, in each of the oxide semiconductor layers 40S and 40D, the resistance values differ from each other in a stack direction, and the resistance value of the upper layer portion is less than that of the lower layer portion. The oxide semiconductor layers 40S and 40D in at least one embodiment are placed in a low resistance state by desorption of oxygen.

The oxide semiconductor layers 30, 40S, and 40D are formed in a predetermined shape, on the undercoat layer 20. Moreover, the oxide semiconductor layers 30, 40S, and 40D include the same material. A transparent amorphous oxide semiconductor (TAOS) is used for the material of the oxide semiconductor layers 30, 40S, and 40D, for example. In at least one embodiment, metallic elements included in each of the oxide semiconductor layers 30, 40S, and 40D include at least indium (In) and further at least one or both of gallium (Ga) and zinc (Zn).

The oxide semiconductor layers 30, 40S, and 40D in at least one embodiment each include $InGaZnO_x$ (IGZO), that is, an oxide including indium (In), gallium (Ga), and zinc (Zn).

Moreover, the oxide semiconductor layer 30 includes fluorine (F). Specifically, fluorine is included in a region that is an internal region in the oxide semiconductor layer 30 and is close to the gate insulating layer 50. In other words, fluorine is included on a front channel side of the oxide semiconductor layer 30, and fluorine is included on a side of the gate insulating layer 50 in the oxide semiconductor layer 30. In contrast, the oxide semiconductor layers 40S and 40D include no fluorine.

Fluorine that is chemically bonded is included in the oxide semiconductor layer 30. The region that is the internal region in the oxide semiconductor layer 30 and is close to the gate insulating layer 50 is a region that is on the side of the gate insulating layer 50 and is above at least the middle of a thickness of the oxide semiconductor layer 30.

The oxide semiconductor layer 30 in at least one embodiment includes a first region (fluorine-including region) which is a region including fluorine, and a second region (no-fluorine-including region) which is a region including no fluorine.

For example, when the middle of the film thickness of the oxide semiconductor layer 30 is a reference point, the first region in the oxide semiconductor layer 30 is a region (upper layer) above the middle of the film thickness of the oxide semiconductor layer 30, and the second region in the oxide semiconductor layer 30 is a region (lower layer) below the middle of the film thickness of the oxide semiconductor layer 30.

In this case, the first region, the upper layer, in the oxide semiconductor layer 30 is a region on the side of the gate insulating layer 50 (front channel side) in the oxide semiconductor layer 30. In at least one embodiment, fluorine is included only in the region on the side of the gate insulating layer 50 (side of the gate electrode 70) in the oxide semiconductor layer 30. In contrast, the second region, the lower layer, in the oxide semiconductor layer 30 is a region on the side of the substrate 10 (back channel side) in the oxide semiconductor layer 30.

As stated before, in the oxide semiconductor layer 30, the region on the side of the gate insulating layer 50 has a fluorine concentration higher than that of the region on the side of the undercoat layer 20.

The fluorine-including region in the oxide semiconductor layer 30 may have a thickness of at least 5 nm. In at least one embodiment, the fluorine-including region has a thickness of at least 15 nm. In at least one embodiments, the fluorine-including region has a thickness of at least 20 nm. Moreover, the oxide semiconductor layer 30 may have, as a whole, a film thickness of at least 20 nm.

Setting the film thickness of the fluorine-including region in the oxide semiconductor layer 30 to be at least 5 nm helps to sufficiently exert the aforementioned effect of including fluorine.

Moreover, even when hydrogen diffuses from the outside of the oxide semiconductor layer 30 by annealing or the like, setting the film thickness of the fluorine-including region in the oxide semiconductor layer 30 to be at least 15 nm enables the fluorine-including region in the oxide semiconductor layer 30 to block diffusing hydrogen. In at least one embodiment, the fluorine-including region is formed on the side of the gate insulating layer 50, and thus hydrogen entering the oxide semiconductor layer 30 from the side of the gate insulating layer 50 can be effectively blocked. With this, stable thin film transistor characteristics are obtained.

Moreover, setting the film thickness of the fluorine-including region in the oxide semiconductor layer 30 to be at least 20 nm helps to sufficiently perform process control of the oxide semiconductor layer 30. In other words, setting the film thickness of the fluorine-including region in the oxide semiconductor layer 30 to be at least 20 nm helps to set the film thickness of the oxide semiconductor layer 30 as a whole to be at least 20 nm. With this, deposition of the oxide semiconductor layer 30 by sputtering or the like is possible, and patterning of the oxide semiconductor layer 30 is possible by a photolithography or etching method, for example.

Furthermore, although the device characteristics of the oxide semiconductor layer 30 deteriorate when the oxide semiconductor layer 30 is damaged by hydrogen annealing, with regard to the oxide semiconductor layer 30 whose surface is damaged by hydrogen annealing, the device characteristics can be recovered by etching 20 nm from the hydrogen-exposed surface. Accordingly, the fluorine-including region in the oxide semiconductor layer 30 may be have a film thickness of at least 20 nm.

Setting the film thickness of the oxide semiconductor layer 30 as a whole to be at least 20 nm makes helps to obtain stable device characteristics as a TFT.

Moreover, although the gate insulating layer 50 sometimes includes fluorine, the oxide semiconductor layer 30 has a fluorine concentration higher than that of the gate insulating layer 50. In addition, in at least one embodiment, the oxide semiconductor layer 30 has a fluorine concentration higher than a hydrogen concentration of the oxide semiconductor layer 30. In at least one embodiment, the oxide semiconductor layer 30 has a fluorine concentration of at least $1 \times 10^{22}$ atm/cm$^3$.

The gate insulating layer 50 (insulating layer) is formed above the oxide semiconductor layers 30, 40S, and 40D. The gate insulating layer 50 is, for example, a single layer insulating layer of an oxide insulating layer or a nitride insulating layer, or a stacked insulating layer including an oxide insulating layer and a nitride insulating layer. The gate insulating layer 50 may be a single layer film of silicon oxide, aluminum oxide (alumina), silicon nitride, silicon oxynitride, tantalum oxide, or the like, or stacked films of these. The gate insulating layer 50 having a stacked layer structure may be stacked films of a silicon oxide film and an aluminum oxide film (alumina film). The film thickness of the insulating layer 50 can be designed by taking into consideration pressure resistance of the TFT or the like, and in at least one embodiment ranges from 50 to 500 nm, for example.

In at least one embodiment, the gate insulating layer 50 is formed by atomic layer deposition (ALD). For example, the gate insulating layer 50 is deposited by causing a surface chemical reaction in the interface of an oxide semiconductor film by supplying the oxide semiconductor film with reactive gas containing molecules (precursors) including an alkyl group ($—C_nH_{2n+1}$) and elements included in the gate insulating layer 50.

For example, when a silicon oxide film (SiO film) is deposited as the gate insulating layer 50 by ALD, tris (dimethylamino)silane ($C_6H_{19}N_3Si$) or tetraethoxysilane ($Si(OC_2H_5)_4$)) may be used as molecules containing an alkyl group and Si elements included in the gate insulating layer 50.

Furthermore, when an aluminum oxide film ($AlO_x$ film) is deposited as the gate insulating layer 50 by ALD, trimethylaluminum ($Al(CH_3)_3$) may be used as molecules containing an alkyl group and Al elements included in the gate insulating layer 50.

The gate insulating layer 50 may be formed by another method such as plasma CVD, instead of ALD.

Moreover, as stated above, the gate insulating layer 50 sometimes includes fluorine. In this case, fluorine included in the gate insulating layer 50 is fluorine diffused from the fluorine-including layer 60, and is thought to be chemically adsorbed to dangling bonds in the gate insulating layer 50. In other words, fluorine in the gate insulating layer 50 is thought to be chemically bonded with the elements constituting the gate insulating layer 50. Although some fluorine in the gate insulating layer 50 is thought to be physically adsorbed, chemically bonded fluorine in the gate insulating layer 50 is thought to be more dominant.

The fluorine-including layer 60 is a layer including at least fluorine (F). Moreover, the fluorine-including layer 60 functions as a fluorine-supplying layer that supplies other layers with fluorine by fluorine included in the fluorine-including layer 60 being diffused by subsequent annealing. As described later, fluorine in the fluorine-including layer 60 compensates oxygen deficiency in the oxide semiconductor film by being diffused into the oxide semiconductor film by annealing.

The fluorine-including layer 60 in at least one embodiment is an insulating layer made of an insulating material. The fluorine-including layer 60 may be a fluorine layer including only fluorine or an organic layer which includes fluorine and is made of an organic material.

When the fluorine-including layer 60 is the fluorine layer, for example, the fluorine-including layer 60 is a layer obtained by fluorine being physically adsorbed above the oxide semiconductor layer 30.

In contrast, when the fluorine-including layer 60 is the organic layer, fluorine is physically adsorbed in the organic material (organic layer). Examples of the organic material to which fluorine is physically adsorbed include a resin material such as CYTOP. The fluorine-including layer 60, the organic layer, may include both fluorine physically adsorbed to the organic layer and fluorine physically bonded with the organic material of the organic layer. However, in at least one embodiment, fluorine physically adsorbed is more dominant than fluorine chemically bonded with the organic material.

Furthermore, when the fluorine-including layer 60 is the organic layer, the gate insulating layer 50 may be an inorganic layer includes an inorganic material such as a resin material. In this case, the gate insulating layer 50 is, for example, a silicon oxide layer or an aluminum oxide layer.

Moreover, evaluating whether chemically bonded fluorine or physically adsorbed fluorine is dominant in the fluorine-including layer 60 or the gate insulating layer 50 is possible, by using X-ray photoelectron spectroscopy (XPS).

For example, even when fluorine is physically adsorbed or chemically bonded, a peak appears in an F1s XPS spectrum. Evaluate whether chemically bonded fluorine or physically adsorbed fluorine is dominant is possible, depending on whether the peak is on a high binding energy side or a low binding energy side in the XPS spectrum.

The fluorine-including layer 60 is formed at a position opposite the oxide semiconductor layer 30 with the gate insulating layer 50 being between the fluorine-including layer 60 and the oxide semiconductor layer 30. In addition, the fluorine-including layer 60 is disposed between the gate insulating layer 50 and the gate electrode 70.

In at least one embodiment, a channel direction length of the fluorine-including layer 60 is almost identical to a channel direction length of the oxide semiconductor layer 30 and a channel direction length of the gate electrode 70. In other words, in cross-sectional view, both side surfaces of the fluorine-including layer 60 are flush with both side surfaces of the oxide semiconductor layer 30 as well as both side surfaces of the gate electrode 70. Moreover, in plan view, the gate electrode 70, the fluorine-including layer 60, and the oxide semiconductor layer 30 may be formed to completely overlap with each other. In this case, the fluorine-including layer 60 does not overlap with the oxide semiconductor layers 40S and 40D, and the oxide semiconductor layers 40S and 40D are not below the fluorine-including layer 60.

The gate electrode 70 is formed at a position opposite the oxide semiconductor layer 30 with the gate insulating layer 50 being between the gate electrode 70 and the oxide semiconductor layer 30. In at least one embodiment, the gate electrode 70 is formed at a position opposite the oxide semiconductor layer 30 with the gate insulating layer 50 and the fluorine-including layer 60 being between the gate electrode 70 and the oxide semiconductor layer 30. Specifically, the gate electrode 70 is formed in a predetermined shape, on the fluorine-including layer 60.

The gate electrode 70 is an electrode having a single layer structure or a multi-layer structure including a conductive material such as metal or an alloy thereof, and may include molybdenum (Mo), aluminum (Al), copper (Cu), tungsten (W), titanium (Ti), chrome (Cr), or molybdenum tungsten (MoW), for example. In at least one embodiment, the film thickness of the gate electrode 70 is set to be from 50 to 300 nm.

The interlayer insulating layer 80 is formed to cover the gate electrode 70 and the oxide semiconductor layers 40S and 40D. The interlayer insulating layer 80 may be made of a material including an organic substance as a main component or may include an inorganic substance such as silicon oxide, silicon nitride, silicon oxynitride, and aluminum oxide. In addition, the interlayer insulating layer 80 may be a single layer film or a film having stacked layers. The interlayer insulating layer 80 having a stacked layer structure may be, for example, stacked films of a silicon oxide film and an aluminum oxide film.

Moreover, in the interlayer insulating layer 80, openings (contact holes) are formed to penetrate part of the interlayer insulating layer 80. The oxide semiconductor layer 40S is connected to the source electrode 90S, and the oxide semiconductor layer 40D is connected to the drain electrode 90D, via the openings of the interlayer insulating layer 80.

The source electrode 90S and the drain electrode 90D are formed in a predetermined shape, on the interlayer insulating layer 80. Moreover, the source electrode 90S and the drain electrode 90D are each electrically connected to the oxide semiconductor layer 30. In the embodiment, the source electrode 90S and the drain electrode 90D are each electrically and physically connected to a different one of the oxide semiconductor layers 40S and 40D via the openings formed in the interlayer insulating layer 80, and are electrically connected to the oxide semiconductor layer 30 via the oxide semiconductor layers 40S and 40D.

The source electrode 90S and the drain electrode 90D each are an electrode having a single layer structure including an conductive material or an alloy thereof, or a stacked layer structure of these. The source electrode 90S and the drain electrode 90D may include, for example, molybdenum (Mo), aluminum (Al), copper (Cu), tungsten (W), titanium (Ti), chrome (Cr), molybdenum tungsten alloy (MoW), or copper manganese allow (CuMn). In at least one embodiment, the film thickness of the source electrode 90S and the drain electrode 90D is set to be from 50 to 300 nm, for example.

[Method for Manufacturing Thin Film Transistor]

Next, a method for manufacturing the thin film transistor 1 according to at least one embodiment will be described with reference to FIGS. 2A to 2I. FIGS. 2A to 2I are cross-sectional views of processes in the method for manufacturing the thin film transistor according to at least one embodiment of the present description.

Figure 2A:
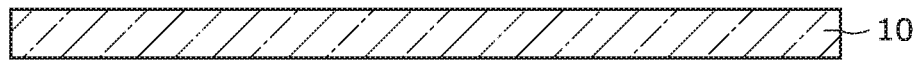
FIG. 2A is a cross-sectional view of a process for preparing a substrate in a method for manufacturing the thin film transistor according to at least one embodiment.

First, in FIG. 2A, the substrate 10 is prepared. A glass substrate is used as the substrate 10, for example.

Figure 2B:
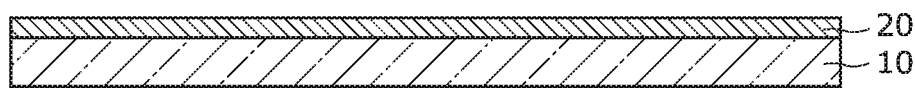
FIG. 2B is a cross-sectional view of a process for forming an undercoat in the method for manufacturing the thin film transistor according to at least one embodiment.

Next, in FIG. 2B, the undercoat layer 20 is formed on the substrate 10. For example, the undercoat layer 20 including a silicon nitride film, a silicon oxide film, a silicon oxynitride film, an aluminum oxide film, or the like is formed on the substrate 10 by plasma chemical vapor deposition (CVD) or the like.

Figure 2C:
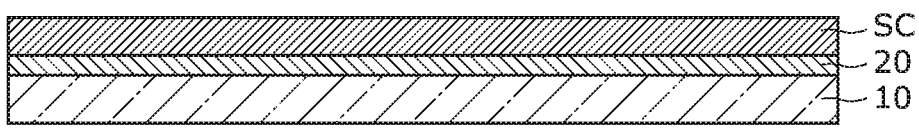
FIG. 2C is a cross-sectional view of a process for depositing an oxide semiconductor film in the method for manufacturing the thin film transistor according to at least one embodiment.

Next, in FIG. 2C, an oxide semiconductor film SC is deposited on the undercoat layer 20. The oxide semiconductor film SC may include an $InGaZnO_x$ transparent amorphous oxide semiconductor. In this case, the oxide semiconductor film ($InGaZnO_x$ film) SC including $InGaZnO_x$ can be deposited by a vapor deposition method such as a sputtering method or a laser evaporation method.

Specifically, a target material including In, Ga, and Zn (for example, a polycrystalline sintered body having an $InGaO_3(ZnO)_4$ composition) is used, an argon (Ar) gas as an inert gas and a gas including oxygen ($O_2$) as a reactive gas are introduced into a vacuum chamber, and voltage of a predetermined power density is applied to the target material.

Though not shown, after the oxide semiconductor film SC is deposited, the oxide semiconductor film SC can be formed in a predetermined shape by patterning the oxide semiconductor film SC using a photolithography or wet etching method.

Specifically, a resist having a predetermined shape is formed on the oxide semiconductor film SC, and part of the oxide semiconductor film SC in a region where the resist is not formed is removed by wet etching, thereby forming the oxide semiconductor film SC having an island shape. When the oxide semiconductor film SC includes $InGaZnO_x$, a chemical solution obtained by mixing, for example, phosphoric acid ($H_3PO_4$), nitric acid ($HNO_3$), acetic acid ($CH_3COOH$), and water may be used as an etching solution.

Figure 2D:
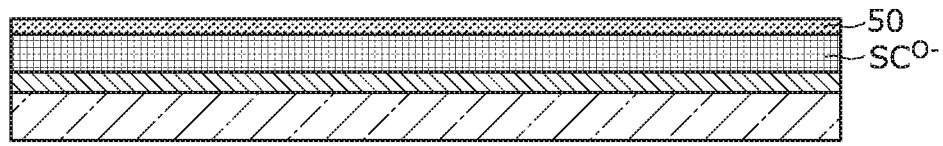
FIG. 2D is a cross-sectional view of a process for forming a gate insulating layer in the method for manufacturing the thin film transistor according to at least one embodiment.

Next, in FIG. 2D, the gate insulating layer 50 is formed on the oxide semiconductor film SC. The gate insulating layer 50 is, for example, a silicon nitride film, a silicon oxide film, a silicon oxynitride film, a tantalum oxide film, an aluminum oxide film, or stacked layers of these. In at least one embodiment, the gate insulating layer 50 is deposited by ALD. Specifically, the gate insulating layer 50 is deposited as a whole on a top surface of the oxide semiconductor film SC by ALD. Processing costs are reduced by depositing the gate insulating layer 50 as a whole.

Figure 3A:
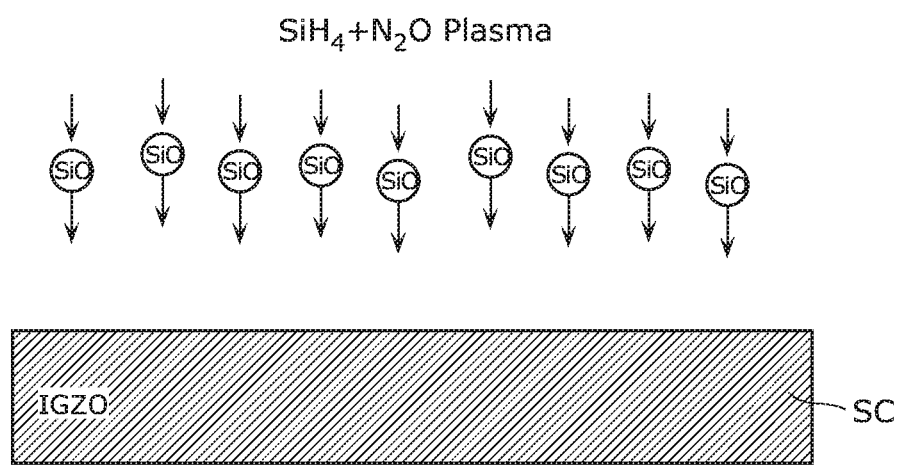
FIGS. 3A-B are diagrams of depositing a gate insulating layer on an oxide semiconductor film by plasma chemical vapor deposition (CVD) according to at least one embodiment.
Figure 3B:
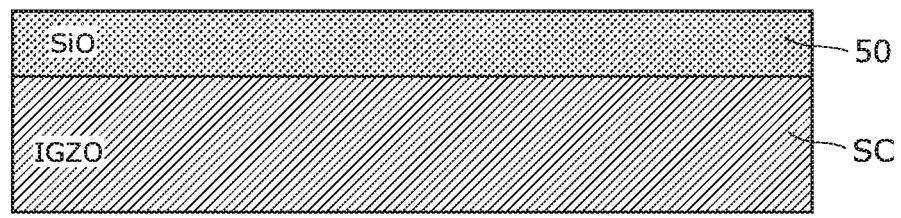

Moreover, the gate insulating layer 50 may be deposited not by ALD but by plasma CVD. For example, when a SiO film is deposited as the gate insulating layer 50 by plasma CVD, as in FIGS. 3A-B, the SiO film can be deposited using a mixture gas of monoslinae ($SiH_4$) and nitrous oxide ($N_2O$).

When the SiO film is deposited by plasma CVD, the SiO film is deposited by $SiH_4$ gas and $N_2O$ gas being reacted with each other in a vapor phase, but, in this case, unlike ALD, a reaction does not occur in which the oxide semiconductor film SC is placed in the low resistance state. Accordingly, when a source region and a drain region are formed in the oxide semiconductor film SC, part of the oxide semiconductor film SC is placed in the low resistance state by separately performing plasma processing etc.

Figure 2E:
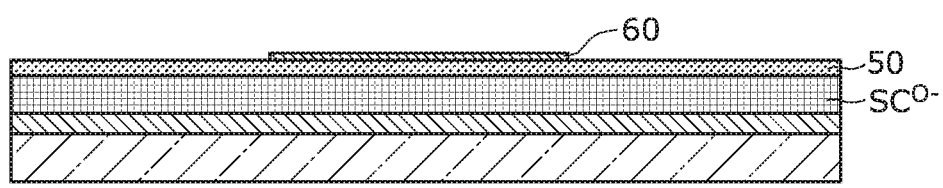
FIG. 2E is a cross-sectional view of a process for forming a fluorine-including layer in the method for manufacturing the thin film transistor according to at least one embodiment.

Next, after the gate insulating layer 50 is formed, in FIG. 2E, the fluorine-including layer 60 is formed on the gate insulating layer 50. The fluorine-including layer 60 is formed on the gate insulating layer 50 above a region of an oxide semiconductor film $SC^{o-}$. Specifically, the fluorine-including layer 60 is formed only above a portion of the oxide semiconductor film $SC^{o-}$ that is to be a channel region.

When a fluorine layer including only fluorine is formed as the fluorine-including layer 60, the fluorine-including layer 60 can be formed by performing, while supplying fluorine system gas, annealing treatment or discharge treatment to adsorb fluorine on the gate insulating layer 50. In this case, the fluorine-including layer 60 is formed as a layer obtained by fluorine being physically adsorbed to a surface of the gate insulating layer 50.

Moreover, as stated above, although the fluorine-including layer 60 is formed only above the portion of the oxide semiconductor film $SC^{o-}$ that is to be the channel region, in this case, fluorine system gas may be supplied after a mask is placed to cover a portion of the gate insulating layer 50 (portion in which the fluorine-including layer 60 is not formed). As a result, the fluorine-including layer 60 only above the portion of the oxide semiconductor film $SC^{o-}$ that is to be the channel region.

In contrast, when an organic layer including fluorine is formed as the fluorine-including layer 60, the organic layer including fluorine is formed by forming an organic layer by applying an organic material to only a predetermined region of the gate insulating layer 50, and by adsorbing fluorine to the organic layer.

It is to be noted that a method for forming the fluorine-including layer 60 is not limited to a method by which fluorine of the fluorine-including 60 is diffused into the oxide semiconductor film $SC^{o-}$ via the gate insulating layer 50 in subsequent annealing.

Figure 2F:
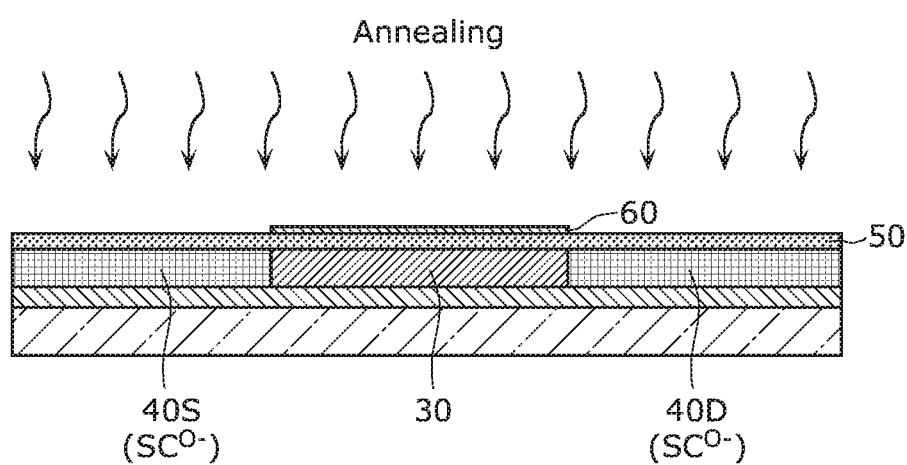
FIG. 2F is a cross-sectional view of a process for annealing in the method for manufacturing the thin film transistor according to at least one embodiment.

Next, in FIG. 2F, the fluorine-including layer 60 is annealed after the fluorine-including layer 60 is formed. This annealing causes fluorine to diffuse (thermal diffuse) from the fluorine-including layer 60, and to be chemically bonded in the oxide semiconductor film $SC^{o-}$. An annealing temperature may be at least a temperature at which fluorine adsorbed to the fluorine-including layer 60 on the gate insulating layer 50 starts to desorb, and is, for example, 300° C.

The details of the annealing at this time will be described with reference to FIG. 4. FIG. 4 is a diagram for describing the details of the annealing in FIG. 2F.

Figure 4A:
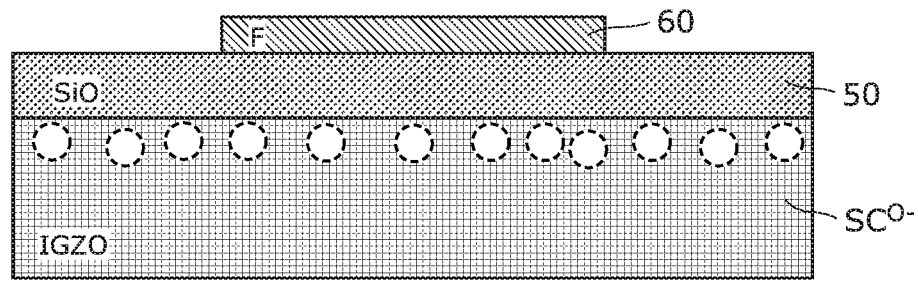
FIGS. 4A-C are diagrams of details for annealing in FIG. 2F according to at least one embodiment.

In FIG. 4A, in at least one embodiment, the fluorine-including layer 60 is formed only above a region of the oxide semiconductor film $SC^{o-}$. Subsequently, in FIG. 4B, the annealing causes fluorine to thermally diffuse only into a portion covered with the fluorine-including layer 60 and included in the region of the oxide semiconductor film $SC^{o-}$ (region in which the reactive gas when the gate insulating layer 50 is deposited causes oxygen to desorb from the oxygen semiconductor film SC), and to be chemically bonded in the oxide semiconductor film $SC^{o-}$. Accordingly, oxygen deficiency in the oxide semiconductor film $SC^{o-}$ caused when the gate insulating layer 50 is deposited by ALD is compensated for with fluorine diffused from the fluorine-including layer 60.

In consequence, in FIG. 4C, because the oxygen deficiency is compensated for with fluorine diffused from the fluorine-including layer 60, the portion of the oxide semiconductor film $SC^{o-}$ directly below and covered with the fluorine-including layer 60 becomes the oxide semiconductor layer 30 functioning as the channel layer. In other words, a function as a semiconductor layer is restored by compensating, with fluorine, the oxide semiconductor film which is placed in a low resistance state (conductive state) by the desorption of oxygen.

In contrast, because the oxygen deficiency is not compensated for with fluorine, portions of the oxide semiconductor film $SC^{o-}$ not covered with the fluorine-including layer 60 remain low resistance regions and become the oxide semiconductor layers 40S and 40D respectively functioning as the source region and the drain region.

Although fluorine is not actively diffused into the oxide semiconductor layers 40S and 40D, when fluorine is diffused into the oxide semiconductor layer 30, fluorine may naturally go into the oxide semiconductor layers 40S and 40D. Accordingly, surface layers or regions of the oxide semiconductor layers 40S and 40D neighboring the oxide semiconductor layer 30 may slightly include fluorine.

Moreover, when the fluorine-including layer 60 is either the fluorine layer or the organic layer including fluorine, the fluorine-including layer 60 is present after the annealing. In this case, the fluorine-including layer 60 still includes fluorine after the annealing.

As stated above, the oxide semiconductor layer 30 is selectively formed as usable as the channel layer, the oxide semiconductor layer 40S to be the source region, and the oxide semiconductor layer 40D to be the drain region, by compensating, with fluorine, the oxygen deficiency in the portion of the oxide semiconductor film $SC^{o-}$ caused when the gate insulating layer 50 is deposited by ALD, and by intentionally leaving the other portions thereof without compensating the other portions with fluorine. In other words, the source region (oxide semiconductor layer 40S) and the drain region (oxide semiconductor layer 40D) are formed in a self-aligning manner, by selectively compensating, with fluorine, the oxygen deficiency in the portion of the oxide semiconductor film $SC^{o-}$, and by leaving the other portions with the oxygen deficiency as the low resistance regions.

Figure 4B:
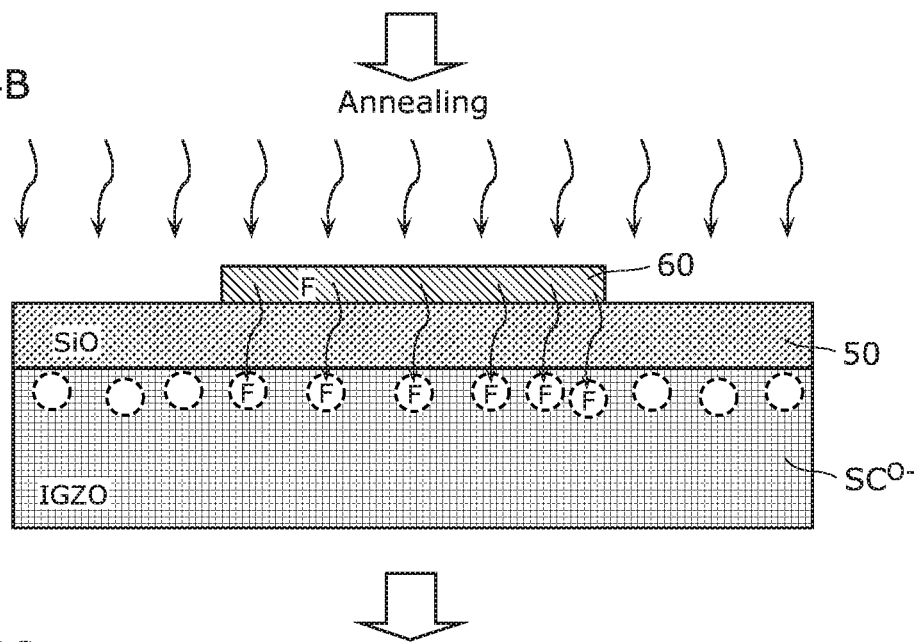
Figure 4C:
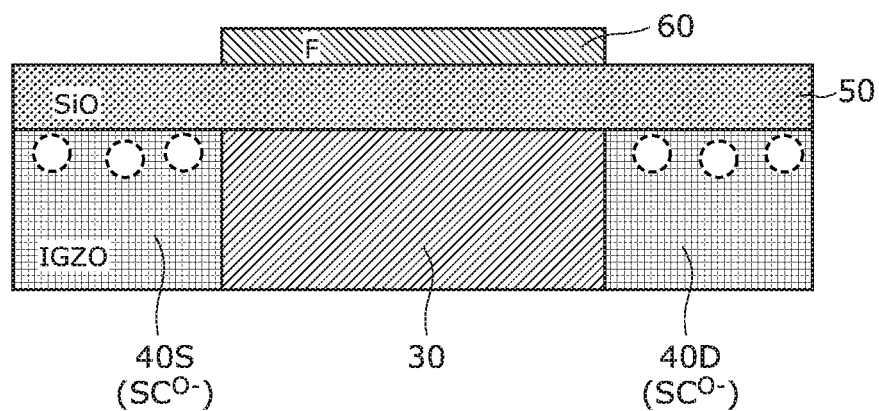

When fluorine diffuses from the fluorine-including layer 60 into the oxide semiconductor film $SC^{o-}$, see FIGS. 4A-C, fluorine passes through the gate insulating layer 50. At this time, fluorine may be present in the gate insulating layer 50 by being captured by dangling bonds (defects) in the gate insulating layer 50. In other words, dangling bonds in the gate insulating layer 50 are terminated with fluorine by diffusing fluorine via the gate insulating layer 50.

Moreover, a peak position of an F1S XPS spectrum in the fluorine-including layer 60 shifts closer to the high biding energy side after the annealing than before the annealing. Accordingly, after the annealing, chemically bonded fluorine seems to be more dominant than physically bonded fluorine in the fluorine-including layer 60.

Furthermore, in at least one embodiment, a peak position of an Si2p XPS spectrum in the gate insulating layer 50 shifts closer to the high binding energy side after the annealing than before the annealing. This is because the annealing seems to have caused fluorine to be chemically bonded in the gate insulating layer 50.

Figure 2G:
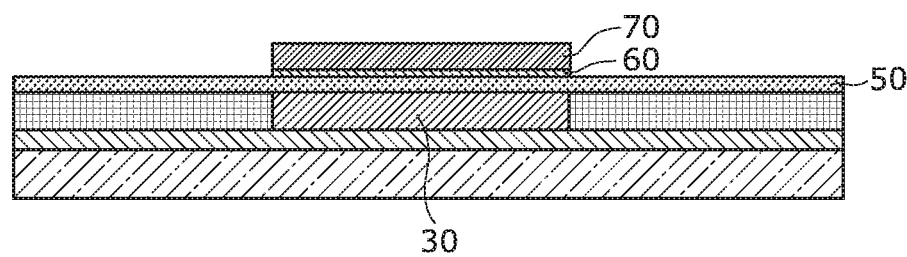
FIG. 2G is a cross-sectional of illustrating a process for forming a gate electrode in the method for manufacturing the thin film transistor according to at least one embodiment.

Next, in FIG. 2G, the gate electrode 70 is formed on the fluorine-including layer 60. In the embodiment, the gate electrode 70 is formed only above the fluorine-including layer 60 and the oxide semiconductor layer 30, but the embodiment is not limited to this.

For example, the gate electrode 70 is formed in a predetermined shape by depositing, by sputtering, a metal film (gate metal film) including molybdenum tungsten (MoW), and then by patterning the metal film using a photolithography or wet etching method. For the wet etching of MoW, a chemical solution can be used which is obtained by mixing, for example, phosphoric acid ($HPO_4$), nitric acid ($HNO_3$), acetic acid ($CH_3COOH$), and water in a predetermined combination ratio.

Figure 2H:
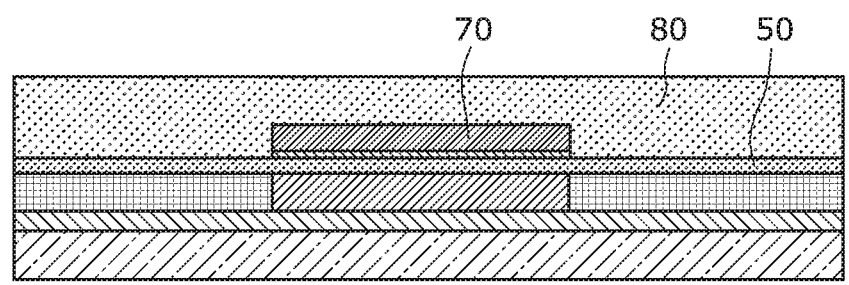
FIG. 2H is a cross-sectional view of a process for forming an interlayer insulating layer in the method for manufacturing the thin film transistor according to at least one embodiment.

Next, in FIG. 2H, the interlayer insulating layer 80 is formed to cover the gate insulating layer 50 and the gate electrode 70. The interlayer insulating layer 80 may include an organic substance as a main component or an inorganic substance such as a silicon oxide film. For example, a silicon oxide film may be deposited as the interlayer insulating layer 80 by plasma CVD.

Then, the openings (contact holes) are formed in the interlayer insulating layer 80 to expose part of each of the oxide semiconductor layers 40S and 40D. Specifically, part of the interlayer insulating layer 80 is etched away by a photolithography or etching method, thereby forming the openings above connection portions with the source electrode 90S and the drain electrode 90D in the respective oxide semiconductor layers 40S and 40D. For example, when the oxide semiconductor layers 40S and 40D each are a silicon oxide film, the openings can be formed in the silicon oxide film by a dry etching method such as a reactive ion etching (RIE) method. In this case, carbon tetrafluoride ($CF_4$) and oxygen gas ($O_2$), for example, can be used as etching gas.

Figure 2I:
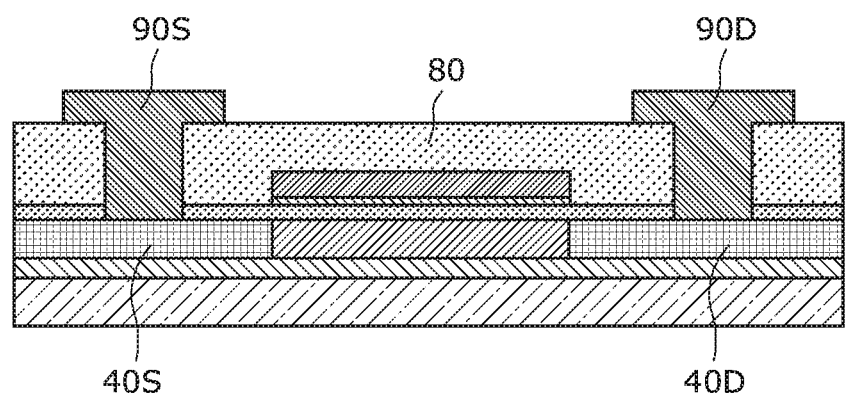
FIG. 2I is a cross-sectional view of a process for forming a source electrode and a drain electrode in the method for manufacturing the thin film transistor according to at least one embodiment.

Next, in FIG. 2I, the source electrode 90S and the drain electrode 90D are formed which are connected to the oxide semiconductor layers 40S and 40D via the openings formed in the interlayer insulating layer 80. In at least one embodiment, the source electrode 90S and the drain electrode 90D having a predetermined shape are formed by depositing, by sputtering, a metal film (source-drain metal film) on the interlayer insulating layer 80 to fill the openings formed in the interlayer insulating layer 80, and then by patterning the metal film using the photolithography or wet etching method.

Though not illustrated, for example, a heat treatment at 300° C. (annealing) is performed subsequently. This heat treatment makes it possible to reduce oxygen deficiency in the oxide semiconductor layer 30 to stabilize characteristics of the oxide semiconductor layer 30.

[Operational Effect of Thin Film Transistor]

The following describes an operational effect of the thin film transistor 1 according to at least one embodiment together with the background to the present description.

In recent years, not only bottom-gate oxide semiconductor TFTs but also top-gate oxide semiconductor TFTs have been much developed, the bottom-gate oxide semiconductor TFTs being highly compatible with amorphous silicon TFTs for liquid crystal display, the top-gate oxide semiconductor TFTs having merits of, for example, being easily miniaturized and having small parasitic capacitance.

For example, Non Patent Literature (NPL) 1 describes a top-gate TFT in which a gate insulating layer and a gate electrode are formed in the same shape, on a channel region in an oxide semiconductor layer, and a source region and a drain region are formed by placing, into a low resistance state, a region not covered with the gate insulating layer and the gate electrode in the oxide semiconductor layer.

A difficulty in manufacturing the top-gate TFT is how low resistance regions (the source region and the drain region) are formed in the oxide semiconductor layer.

For example, in NPL 1, the source region and the drain region are formed by placing the oxide semiconductor layer into the low resistance state by being exposed to plasma atmosphere including argon gas.

Moreover, in order for low parasitic capacitance, a bottom-gate TFT disclosed by Patent Literature (PTL) 2 uses both hydrogen introduction from a silicon nitride film and plasma processing with hydrogen gas when a source region and a drain region are formed by placing an oxide semiconductor layer into a low resistance state.

However, these methods cause the device characteristics of the TFT to depend on the plasma processing having many variables, which makes mass-producing stable TFTs difficult. In addition, as described in Non Patent Literature (NPL) 2, because an oxide semiconductor layer is very sensitive to hydrogen, a variation in device characteristics or degradation of reliability is caused by process damage resulting from hydrogen or the like in a manufacturing process.

The present description has been conceived based on such knowledge, and the inventor of at least one embodiment of the present description has arrived at an idea of obtaining a thin film transistor having high reliability by forming a fluorine-including layer and diffusing fluorine from the fluorine-including layer into the oxide semiconductor layers 30, 40S, and 40D as described above.

Moreover, the inventor thereof has found a method for forming a low resistance region in an oxide semiconductor layer without using hydrogen or plasma processing, and has succeeded in achieving a thin film transistor including an oxide semiconductor layer having a channel region having high stability, and a source region and a drain region formed with no damage to plasma and hydrogen.

The following describes in detail an operation effect of including fluorine in an oxide semiconductor layer, and a point that a low resistance region can be formed in the oxide semiconductor layer without using plasma and hydrogen, with reference to the drawings.

The inventor has conducted various experiments to verify whether a thin film transistor having high reliability is obtained by including fluorine in an oxide semiconductor layer. The following describes the experiments and analyses thereof. In the following experiments an InGaZnO$_x$ film whose main components of metallic elements are In, Ga, and Zn is used as the oxide semiconductor layer.

Figure 5:
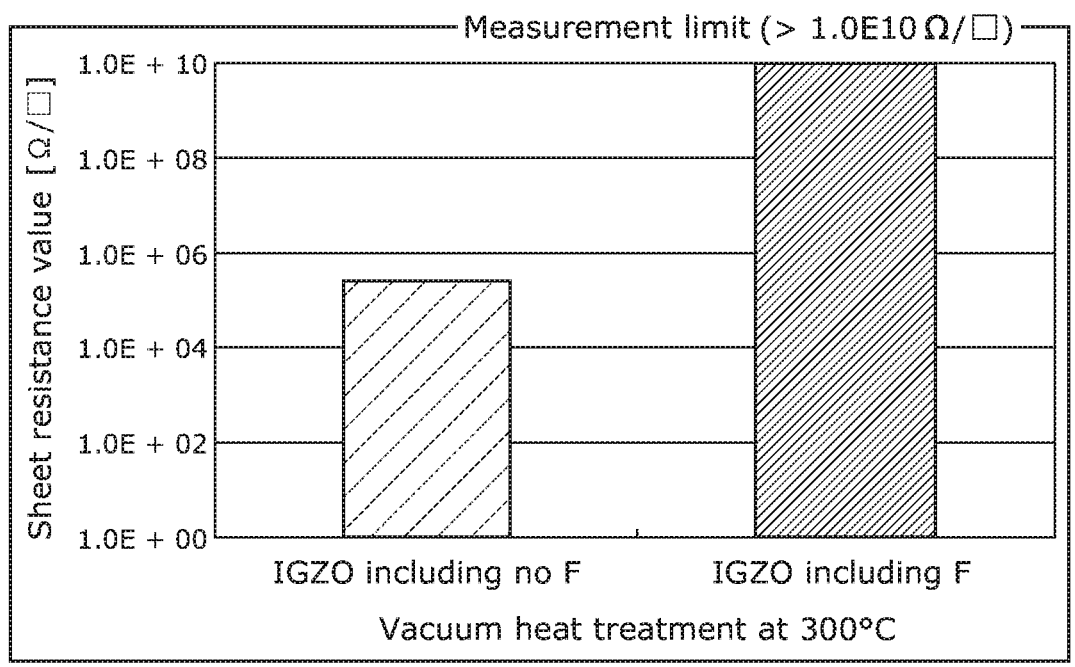
FIG. 5 is a graph of results of measuring a sheet resistance value in the case where fluorine is included in an oxide semiconductor layer, and a sheet resistance value in the case where fluorine is not included in the oxide semiconductor layer according to at least one embodiment.

First, a point that oxygen deficiency can be compensated by including fluorine in the oxide semiconductor layer will be described with reference to FIG. 5. FIG. 5 is a graph of the results of measuring, using four-terminal sensing, a sheet resistance value in vacuum heating (300° C.) for the case where fluorine is included in the oxide semiconductor layer and the case where fluorine is not included in the oxide semiconductor layer.

Charge carriers are generated by oxygen deficiency (desorption of oxygen) to decrease a resistance value of the oxide semiconductor layer. In FIG. 5, a sheet resistance value in the case where fluorine is not included in the oxide semiconductor layer (IGZO including no F) is low such as approximately $1 \times 10^5$ Ω/□.

By contrast, a sheet resistance value in the case where fluorine is included in the oxide semiconductor layer (IGZO including F) is a measurement limit ($>1 \times 10^{10}$ Ω/□) and is higher than the sheet resistance value in the case fluorine is not included in the oxide semiconductor layer.

This is because, since fluorine has higher binding energy with metal than oxygen, including fluorine in the oxide semiconductor layer enables fluorine to eliminate dangling bonds or an unstable site caused by the oxygen deficiency in the oxide semiconductor layer.

These results indicate that including fluorine in the oxide semiconductor layer results in a structure in which charge carriers are less likely to be generated, that is, a structure which compensates the oxygen deficiency to be insensitive to the oxygen deficiency.

Next, a point that hydrogen resistance can be improved by including fluorine in the oxide semiconductor layer will be described with reference to FIGS. 6 to 8.

Figure 6:
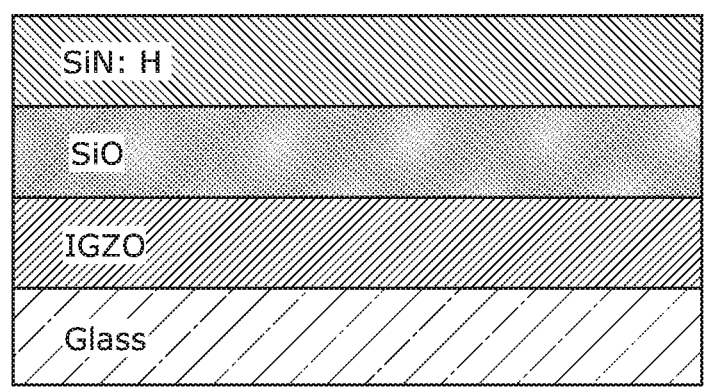
FIG. 6 is a cross-sectional view of a device structure of a sample used in an experiment for hydrogen resistance according to at least one embodiment.

FIG. 6 is a cross-sectional view of a device structure of a sample used in an experiment for hydrogen resistance according to at least one embodiment. In FIG. 6, in the experiment, a sample is used which has a three layer structure in which an oxide semiconductor layer (IGZO), a silicon oxide layer (SiO), and a silicon nitride layer (SiN:H) including hydrogen are stacked above a glass substrate.

Figure 7:
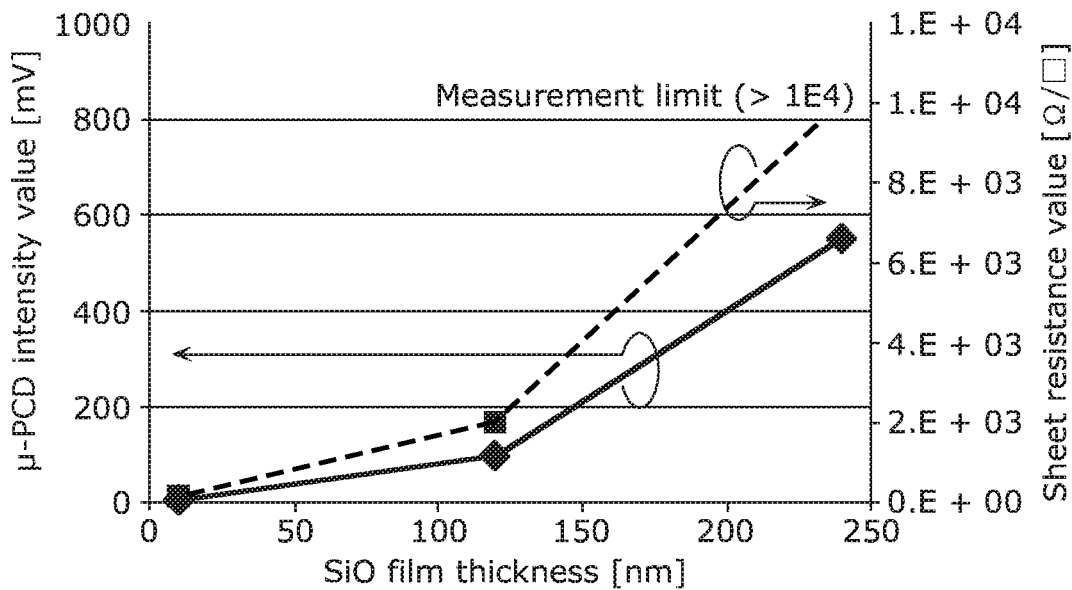
FIG. 7 is a graph, for the sample having the structure illustrated in FIG. 6, of μ-PCD peak intensity and a resistance value of the oxide semiconductor layer when a film thickness of a silicon oxide layer is varied according to at least one embodiment.

FIG. 7 is a graph, for the sample having the structure in FIG. 6, of μ-PCD peak intensity and a resistance value of the oxide semiconductor layer when the film thickness of the silicon oxide layer is varied. The film thickness of the silicon oxide layer is varied to 10 nm, 120 nm, and 240 nm. Moreover, the resistance value of the oxide semiconductor layer is measured by a non-contact resistance measurement device.

In FIG. 7, there is a positive correlation between the resistance value of the oxide semiconductor layer (IGZO) and the μ-PCD peak intensity. In other words, the resistance value of the oxide semiconductor layer (IGZO) and the μ-PCD peak intensity give an indication of determining hydrogen-induced damage due to the presence or absence of fluorine introduction.

Figure 8:
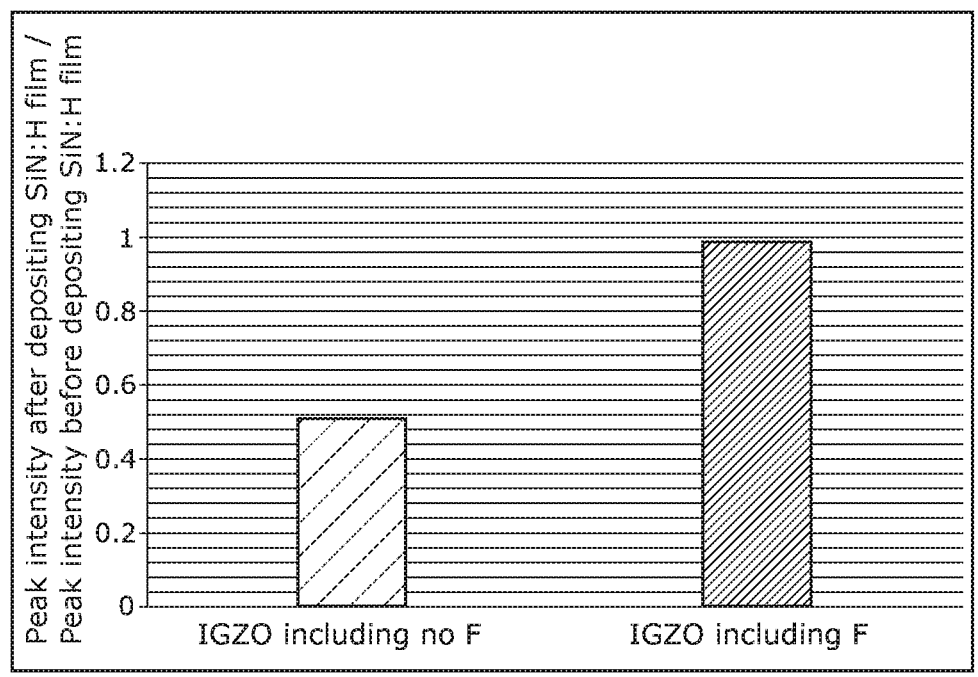
FIG. 8 is a graph of results of comparing μ-PCD peak intensity and the presence or absence of fluorine introduction to an oxide semiconductor layer according to at least one embodiment.

FIG. 8 is a graph of the results of comparing μ-PCD peak intensity and the presence or absence of fluorine introduction to an oxide semiconductor layer.

In FIG. 8, if fluorine is not included in the oxide semiconductor layer, a μ-PCD intensity value (a ratio of a peak intensity value before depositing SiN: H film to a peak intensity value after depositing SiN: H film) in the oxide semiconductor layer decreases. In other words, a resistance value barely varies even if fluorine is introduced when the resistance value is low, that is, the resistance value does not decrease.

In general, if hydrogen is included in an oxide semiconductor layer, the included hydrogen bonds with oxygen in the oxide semiconductor layer to generate charge carriers.

In view of, even if hydrogen is included in the oxide semiconductor layer, including fluorine in the oxide semiconductor layer and bonding fluorine with the oxide semiconductor layer prevent the included hydrogen from bonding with the oxide semiconductor layer. The inventor presumes that since fluorine has one valence arm, there is no valence arm available even if hydrogen enters and hydrogen is inert. As just described, including fluorine in the oxide semiconductor layer can prevent the generation of the charge carriers in the oxide semiconductor layer. In short, including fluorine in the oxide semiconductor layer makes it possible to improve the hydrogen resistance.

Next, a point that a structure of the oxide semiconductor layer is stabilized by including fluorine in the oxide semiconductor layer will be described with reference to FIGS. 9A to 9C and FIG. 10.

Figure 9A:
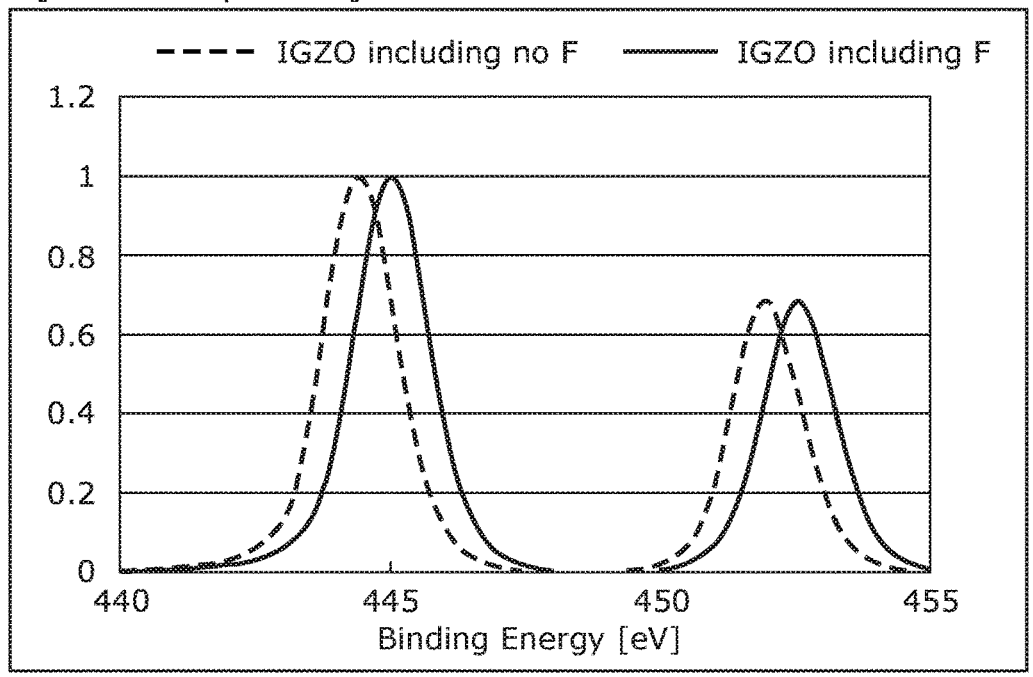
FIG. 9A is a graph of an In3d5 XPS spectrum in the case where fluorine is included in an oxide semiconductor layer, and an In3d5 XPS spectrum in the case where fluorine is not included in the oxide semiconductor layer according to at least one embodiment.
Figure 9B:
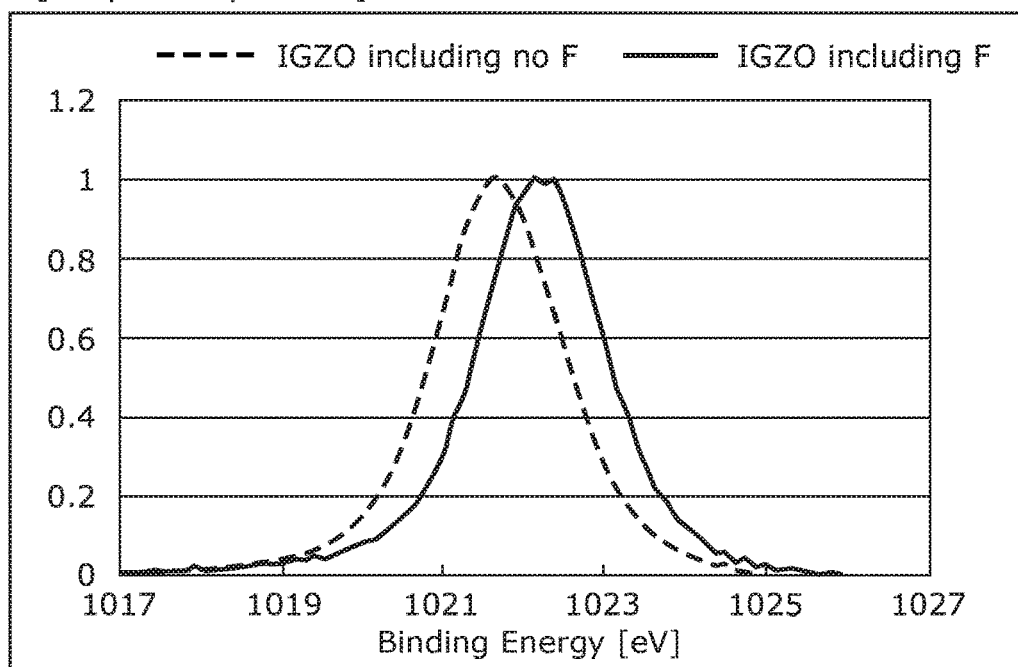
FIG. 9B is a graph of a Zn2p3 XPS spectrum in the case where fluorine is included in an oxide semiconductor layer, and a Zn2p3 XPS spectrum in the case where fluorine is not included in the oxide semiconductor layer according to at least one embodiment.
Figure 9C:
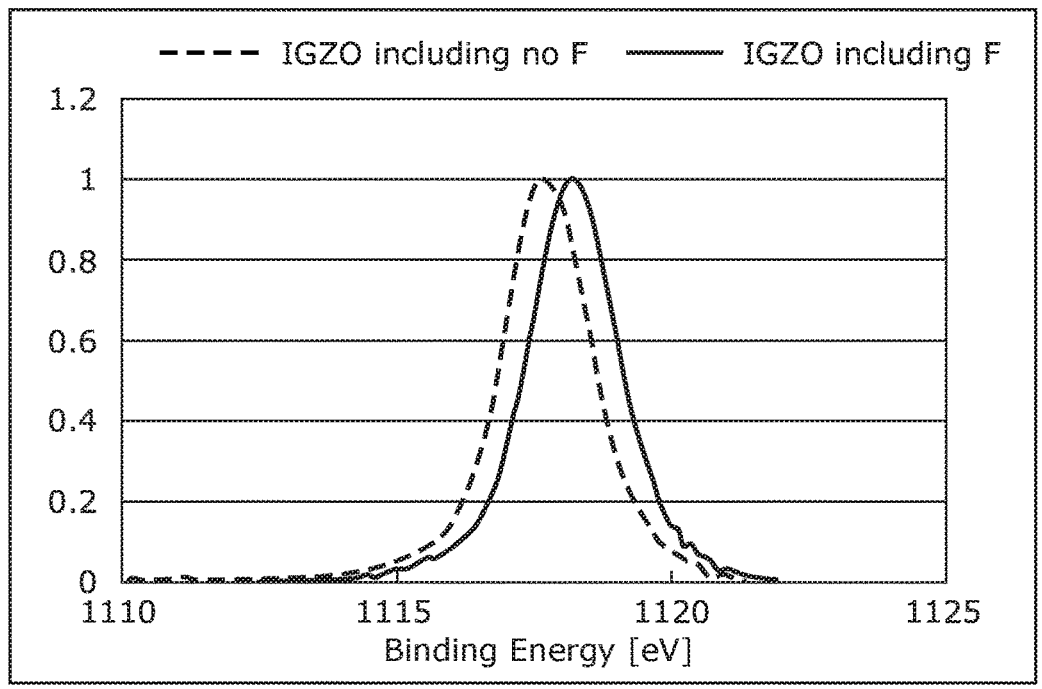
FIG. 9C is a graph of a Ga2p3 XPS spectrum in the case where fluorine is included in an oxide semiconductor layer, and a Ga2p3 XPS spectrum in the case where fluorine is not included in the oxide semiconductor layer according to at least one embodiment.

FIGS. 9A to 9C are each a graph of a corresponding one of In3d5, Zn1p3, and Ga2p3 XPS spectra in the case where fluorine is included in an oxide semiconductor layer (IGZO) (IGZO including F) and a corresponding one of In3d5, Zn1p3, and Ga2p3 XPS spectra in the case where fluorine is not included in an oxide semiconductor layer (IGZO) (IGZO including no F).

In FIG. 9A, the inclusion of fluorine causes a peak position of the In3d5 XPS spectrum to shift to a high binding energy side by at least 0.5 eV. In other words, a peak position of In3d5 in IGZO including F measured by XPS is shifted to the high binding energy side by at least 0.5 eV in comparison to a peak position of In3d5 in IGZO including no F.

Moreover, in FIG. 9B, the inclusion of fluorine causes a peak position of the Zn2p3 XPS spectrum to shift to the high binding energy side by at least 0.4 eV. In other words, a peak position of Zn2p3 in IGZO including F measured by XPS is shifted to the high binding energy side by at least 0.4 eV in comparison to a peak position of Zn2p3 in IGZO including no F.

Furthermore, in FIG. 9C, the inclusion of fluorine causes a peak position of the Ga2p3 XPS spectrum to shift to the high binding energy side by at least 0.5 eV. In other words, a peak position of Ga2p3 in IGZO including F measured by XPS is shifted to the high binding energy side by at least 0.5 eV in comparison to a peak position of Ga2p3 in IGZO including no F.

The results in FIGS. 9A to 9C indicate that including fluorine in the oxide semiconductor layer results in not merely fluorine being physically in the oxide semiconductor layer but in fluorine being chemically bonded with elements included in the oxide semiconductor layer. Consequently, the metallic elements included in the oxide semiconductor layer are less likely to escape.

As just described, including fluorine in the oxide semiconductor layer results in the metallic elements included in the oxide semiconductor layer being chemically bonded with fluorine, which helps to stabilize the structure of the oxide semiconductor layer. With this, a thin film transistor having high reliability is possible.

Figure 10:
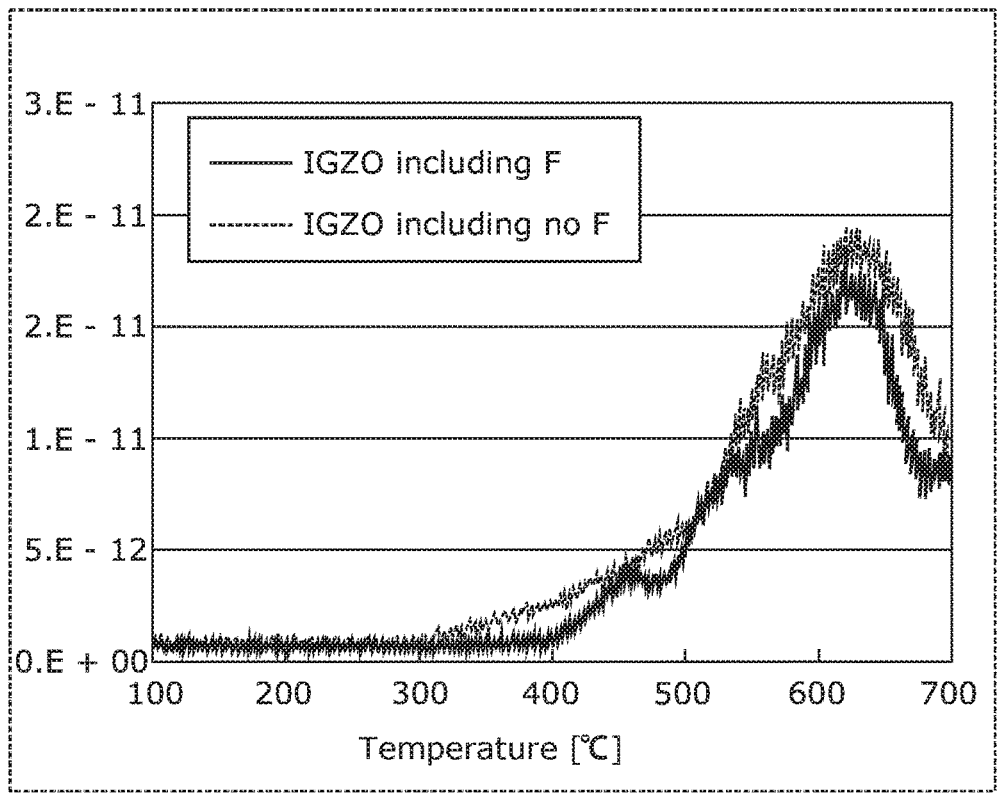
FIG. 10 is a graph of a Zn thermal desorption spectrum by TDS in the case where fluorine is included in an oxide semiconductor layer, and a Zn thermal desorption spectrum by TDS in the case where fluorine is not included in the oxide semiconductor layer according to at least one embodiment.

FIG. 10 is a graph of a Zn thermal desorption spectrum by thermal desorption spectrometry (TDS) in the case where fluorine is included in the oxide semiconductor layer (IGZO) (IGZO including F) and a Zn thermal desorption spectrum by TDS in the case where fluorine is not included therein (IGZO including no F). In FIG. 10 the oxide semiconductor layer in the case where fluorine is included therein has a fluorine concentration of $1 \times 10^{22}$ atm/cm$^3$ or more. Moreover, in FIG. 10, the horizontal axis indicates a temperature (° C.) at which Zn undergoes thermal desorption, and the vertical axis indicates an amount of Zn undergoing thermal desorption (arbitrary unit).

In FIG. 10, the thermal desorption of Zn in the oxide semiconductor layer (IGZO including F) in the case where fluorine is included therein occurs at a temperature higher by at least 50° C. in comparison to the thermal desorption of Zn in the oxide semiconductor layer (IGZO including no F) in the case where fluorine is not included therein. In other words, including fluorine in the oxide semiconductor layer so that the fluorine concentration is at least $1 \times 10^{22}$ atm/cm$^3$ causes the temperature (thermal desorption temperature) at which Zn undergoes the thermal desorption to increase by 50° C.

This is because oxygen desorbs from Zn—O bonds to destabilize Zn, which causes the desorption of Zn. A thermal desorption temperature can be used as a physical property index of an oxide semiconductor layer, and an increase in the thermal desorption temperature indicates that a structure of the oxide semiconductor layer is stabilized.

As just described, also from the standpoint of the thermal desorption temperature of Zn, including fluorine in the oxide semiconductor layer results in the metallic elements included in the oxide semiconductor layer being chemically bonded with fluorine, which helps to stabilize the structure of the oxide semiconductor layer.

From these results, by including fluorine in the oxide semiconductor layer 30, the oxygen deficiency in the oxide semiconductor layer 30 is compensated for to improve the hydrogen resistance of the oxide semiconductor layer 30 and further stabilize the structure of the oxide semiconductor layer 30.

Next, the following describes a point that an insulating layer is formed by chemical reaction in an interface of an oxide semiconductor film caused by supplying reactive gas containing molecules including an alkyl group, and accordingly a source region and a drain region can be formed only by reaction of oxygen deficiency in a top surface of the oxide semiconductor film without using plasma or diffusion of hydrogen. The InGaZnO$_x$ film is used as the oxide semiconductor film (oxide semiconductor layer) in the following experiment as well.

Figure 11:
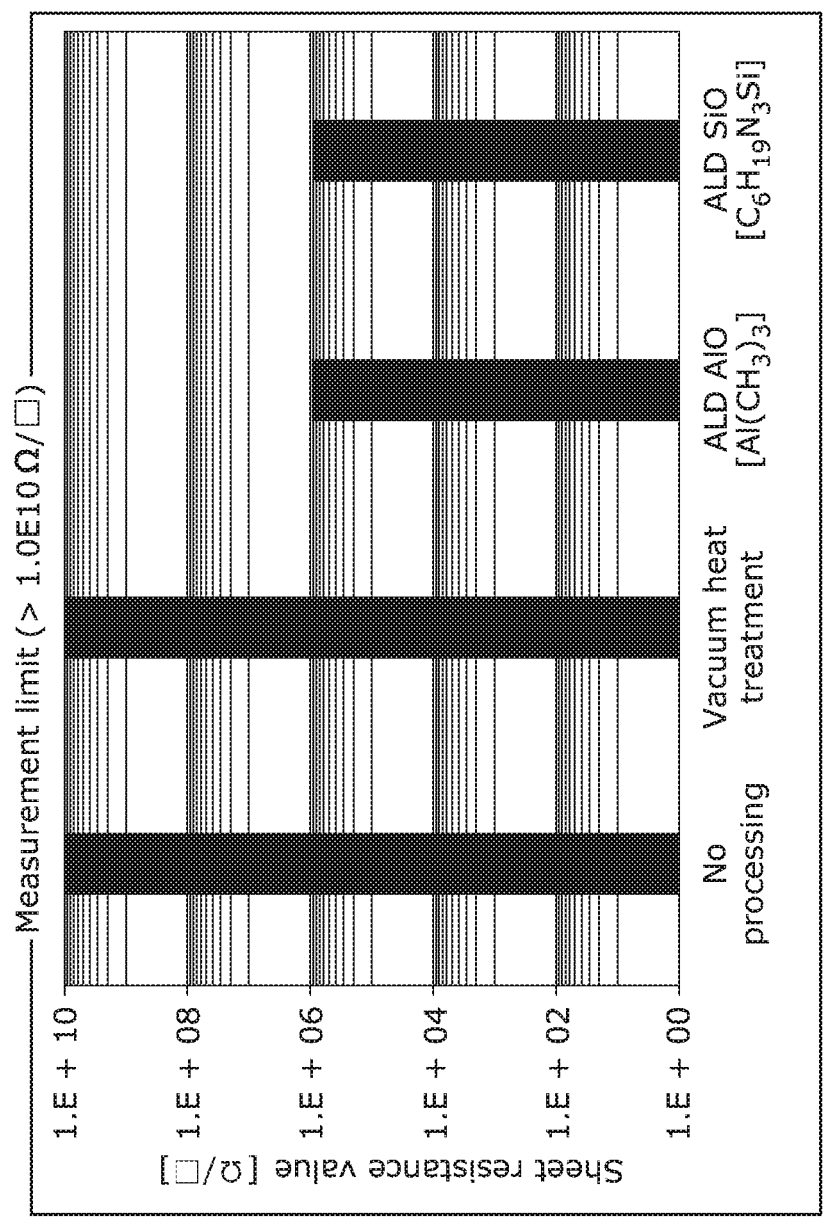
FIG. 11 is a graph of resistance values of an oxide semiconductor film in the case where ALD is used and in the case where ALD is not used according to at least one embodiment.

FIG. 11 is a graph of resistance values of an oxide semiconductor film in the case where ALD is used and in the case where ALD is not used. In FIG. 11, "No processing" indicates a sheet resistance value of an IGZO film (no heating) deposited by plasma CVD, "Vacuum heat treatment" indicates a sheet resistance value of an IGZO film (left under atmosphere of 150° C.) deposited by plasma CVD, "ALD AlO" indicates a sheet resistance value of AlO$_x$ film deposited by ALD using as trimethylaluminum a precursor, and "ALD SiO" indicates a sheet resistance value of an SiO film deposited by ALD using tris(dimethylamino) silane as a precursor.

In FIG. 11, in the cases of "No processing" and "Vacuum heat treatment," the sheet resistance values are a measurement limit (>1E+10 [Ω/□]). Moreover, the sheet resistance values are almost identical between the cases of "No processing" and "Vacuum heat treatment." The application of heat at approximately 150° C. does not cause the oxygen deficiency in the IGZO film, and the resistance value does not vary.

In contrast, in the cases of "ALD AlO" and "ALD SiO," the sheet resistance values are approximately 1E+6 [Ω/□], and it has been found that the sheet resistance values get much lower than in the cases of "No processing" and "Vacuum heat treatment."

As above, factors contributing to the reduction in resistance value of the oxide semiconductor film, a foundation film, by depositing the insulating film by ALD include diffusion of Al metal into the oxide semiconductor film. However, because the SiO film including no metal has the resistance value that is reduced to the same degree as that of the AlO film, the diffusion of Al metal is quite unlikely to be a factor.

Moreover, the oxide semiconductor layer 30 may have a fluorine concentration higher than a carbon concentration of the oxide semiconductor layer 30. Accordingly, sufficiently compensating for the oxygen deficiency in the oxide semiconductor film with fluorine due to carbon is possible.

As above, according to the thin film transistor 1 in at least one embodiment, fluorine is included in a region that is in the oxide semiconductor layer 30 and close to the gate insulating layer 50.

With this, the oxygen deficiency in the oxide semiconductor layer 30 is compensated for with fluorine. Moreover, improving the hydrogen resistance of the oxide semiconductor layer 30 is possible.

Furthermore, the structure of the oxide semiconductor layer 30 is stabilized. Accordingly, a thin film transistor having high reliability and high robustness is possible.

Moreover, according to the thin film transistor 1 in at least one embodiment, the fluorine-including layer 60 is disposed between the gate electrode 70 and the gate insulating layer 50.

With this, shifting a threshold voltage (Vth) of the thin film transistor 1 to the positive side is possible. Accordingly, a thin film transistor having superior device characteristics is possible.

Moreover, according to the thin film transistor 1 in the embodiment, fluorine is not included in the oxide semiconductor layers 40S and 40D to be the source region and the drain region, respectively.

With this, the oxygen deficiency is caused in the oxide semiconductor film, and the oxide semiconductor layer 40S (source region) and the oxide semiconductor layer 40D (drain region) are formed, by placing the oxide semiconductor film into the low resistance state without using plasma or hydrogen.

In particular, in at least one embodiment, an oxygen deficient region (low resistance region) is formed in the oxide semiconductor film SC by carbon when the gate insulating layer 50 is deposited by ALD causing oxygen to desorb, and subsequently fluorine is thermally diffused into the oxygen deficient region of the oxide semiconductor film. Accordingly, the oxide semiconductor film placed in the low resistance state (conductive state) by carbon included in process gas is compensated with fluorine once, which makes it possible to restore the function as the semiconductor layer to the oxide semiconductor film.

Moreover, according to the thin film transistor 1 in at least one embodiment, the region that is in the oxide semiconductor layer 30 and close to the gate insulating layer 50 has a fluorine concentration higher than that of a region that is in the oxide semiconductor layer 30 and far from the gate insulating layer 50.

In other words, a portion of the region (a top surface layer of the oxide semiconductor layer 30) that is in the oxide semiconductor layer 30 and close to the gate insulating layer 50 (fluorine-including layer 60) is the oxygen deficient region, and only this region is compensated with fluorine. With this, reducing an amount of fluorine in the oxide semiconductor layer compared to when the oxide semiconductor layer 30 as a whole is the oxygen deficient region is possible and the whole region is compensated for with fluorine. This helps to keep a carrier density high, and thus it is possible to ensure on-state current. Accordingly, a thin film transistor having superior ON characteristics is possible.

Moreover, according to a method for manufacturing the thin film transistor 1 in at least one embodiment, fluorine is diffused from the fluorine-including layer 60 into the oxide semiconductor film by annealing the fluorine-including layer 60 after the fluorine-including layer 60 is formed.

With this, the oxide semiconductor layer 30 in which the oxygen deficiency in the oxide semiconductor film is compensated for with fluorine is formed. As a result, the oxide semiconductor layer 30 having superior hydrogen resistance as well as a stable structure is formed. Accordingly, a thin film transistor having high reliability and high robustness is possible.

Moreover, in at least one embodiment, the gate insulating layer 50 is disposed between the fluorine-including layer 60 and the oxide semiconductor layer 30. For this reason, when fluorine is thermally diffused from the fluorine-including layer 60 at the time of annealing, fluorine is diffused through the gate insulating layer 50.

Accordingly, the dangling bonds in the gate insulating layer 50 can be terminated with fluorine.

Moreover, according to the method for manufacturing the thin film transistor 1 in at least one embodiment, in the forming of the gate insulating layer 50, the gate insulating layer 50 is deposited on the oxide semiconductor film by supplying reactive gas containing molecules including an alkyl group and elements included in the gate insulating layer 50. Specifically, the gate insulating layer 50 is deposited on the oxide semiconductor film by ALD using the reactive gas containing the molecules including the alkyl group.

Accordingly, in the depositing of the gate insulating layer 50, oxygen desorption is promoted by carbon of the alkyl group desorbing oxygen from the top surface layer of the oxide semiconductor film. In consequence, because the oxygen deficiency occurs in the top surface layer of the oxide semiconductor film SC, placing the oxide semiconductor film SC in the low resistance state is possible.

As above, according to the method in at least one embodiment, placing the oxide semiconductor film in the low resistance state without performing the step involving variables such as unstable plasma or without using hydrogen is possible. This helps to form the source region (oxide semiconductor layer 40S) and the drain region (oxide semiconductor layer 40D), which are the low resistance regions, in the oxide semiconductor film without damage caused by plasma and hydrogen. Accordingly, a thin film transistor having stable device characteristics and high reliability is possible.

Moreover, according to the method for manufacturing the thin film transistor 1 in at least one embodiment, the fluorine-including layer 60 is formed above a portion of the oxide semiconductor film. With this, when fluorine is diffused from the fluorine-including layer 60 by annealing, fluorine is diffused into a portion of the oxide semiconductor film covered with the fluorine-including layer 60 while fluorine is not diffused into portions of the oxide semiconductor film not covered with the fluorine-including layer 60. As a result, regarding the oxygen deficiency in the oxide semiconductor film occurred when the gate insulating layer 50 is deposited by ALD, the portion covered with the fluorine-including layer 60 is compensated with fluorine, and the portions not covered with the fluorine-including layer 60 are not compensated with fluorine, thereby helping to keep the low resistance regions.

With this, a thin film transistor having the source region and the drain region on the respective sides of the channel region is achieved, by forming the portion of the oxide semiconductor film compensated with fluorine as the channel region (oxide semiconductor layer 30), and by forming the portions of the oxide semiconductor film not compensated with fluorine as the source region (oxide semiconductor layer 40S) and the drain region (oxide semiconductor layer 40D). In addition, the source region and the drain region are formed in the self-aligning manner.

Therefore, manufacturing a thin film transistor including the oxide semiconductor layer having the channel region including fluorine and having high stability, and the source region and the drain region formed without damage caused by plasma and hydrogen is possible. In addition, because the source region and the drain region can be formed in the self-aligning manner, stably providing a thin film transistor is possible.

[Display Device]

Figure 12:
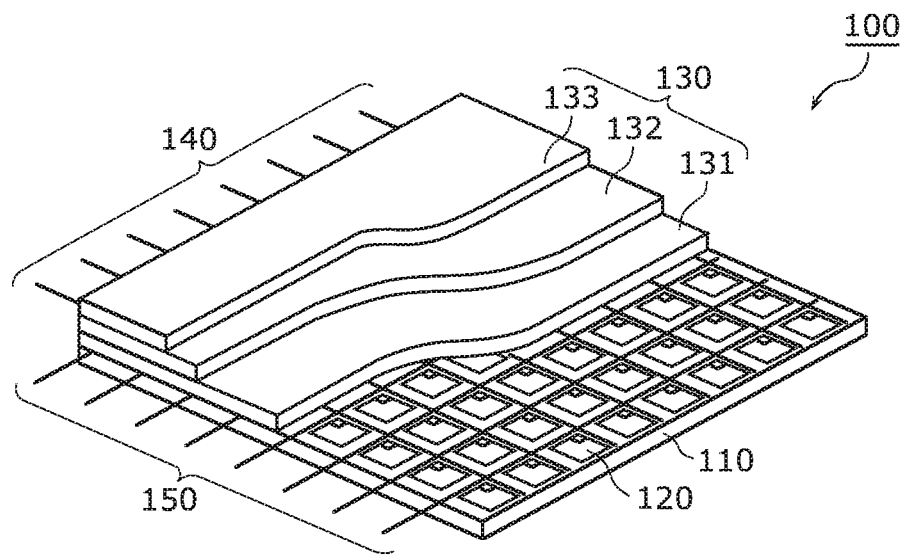
FIG. 12 is a cutaway perspective view of part of an organic EL display device according to at least one embodiment.
Figure 13:
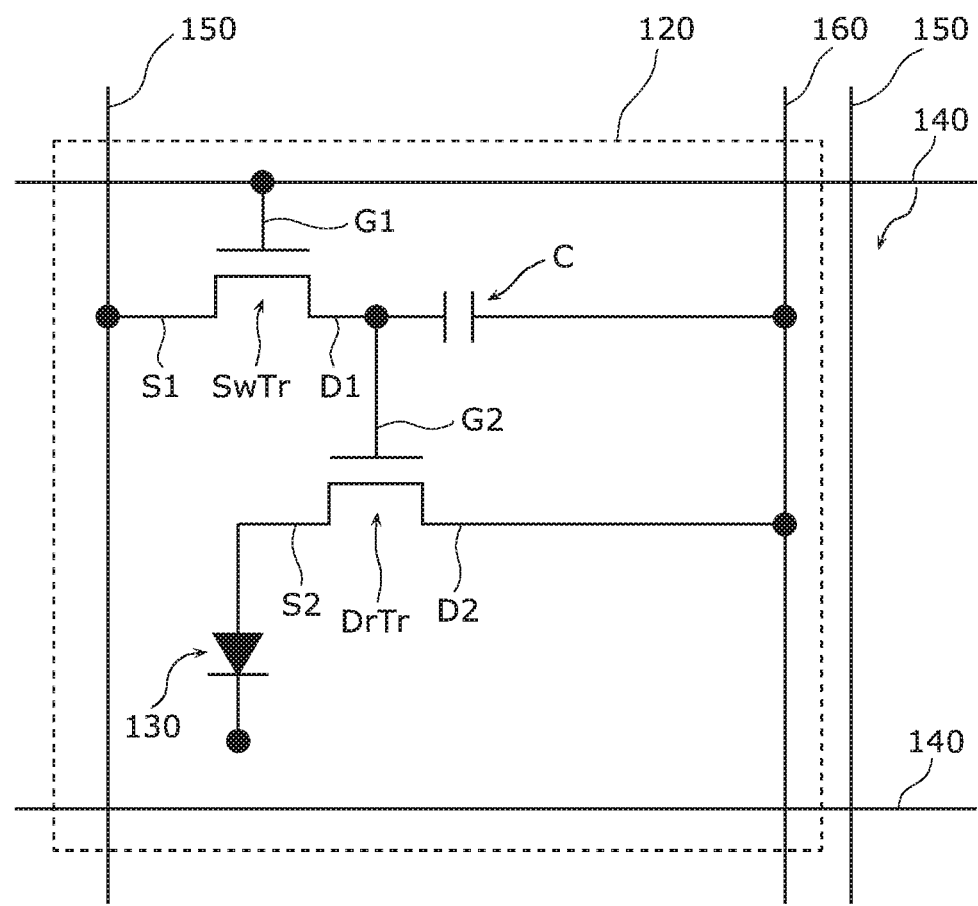
FIG. 13 is an electric circuit diagram of a pixel circuit of the organic EL display device in FIG. 12 according to at least one embodiment.

The following describes an example where the thin film transistor 1 according to the aforementioned embodiment is applied to a display device, with reference to FIGS. 12 and 13. An example of application to an organic EL display device will be described in at least one embodiment.

FIG. 12 is a cutaway perspective view of part of an organic EL display device according to at least one embodiment. FIG. 13 is an electric circuit diagram of a pixel circuit of the organic EL display device in FIG. 12 according to at least one embodiment. The pixel circuit is not limited to the configuration in FIG. 13.

The above-mentioned thin film transistor 1 can be used as a switching transistor SwTr and a driving transistor DrTr of an active matrix substrate in the organic EL display device.

In FIG. 12, an organic EL display device 100 includes a stacked structure of: a TFT substrate (TFT array substrate) 110 in which thin-film transistors are disposed; and organic EL elements (light-emitting units) 130 each including an anode 131 which is a lower electrode (reflecting electrode), and a cathode 133 which is an EL layer (light-emitting layer) 132 and an upper electrode (transparent electrode).

The TFT substrate 110 in at least one embodiment includes the above-mentioned thin film transistor 1. Pixels 120 are arranged in a matrix in the TFT substrate 110, and a pixel circuit is included in each pixel 120.

Each of the organic EL elements 130 is formed corresponding to a different one of the pixels 120, and light emission of the organic EL element 130 is controlled by the pixel circuit included in the corresponding pixel 120. Each organic EL element 130 is formed on an interlayer insulating layer (planarizing layer) formed to cover thin film transistors.

Moreover, the organic EL element 130 has a configuration in which the EL layer 132 is disposed between the anode 131 and the cathode 133. Furthermore, a hole transport layer is formed stacked between the anode 131 and the EL layer 132, and an electron transport layer is formed stacked between the EL layer 132 and the cathode 133. Other function layers may be formed between the anode 131 and the cathode 133. In addition to the EL layer 132, a function layer to be formed between the anode 131 and the cathode 133 is an organic layer including an organic material.

Each pixel 120 is driven and controlled by a corresponding one of the pixel circuits. Moreover, in the TFT substrate 110, gate lines (scanning lines) 140 are disposed along the row direction of the pixels 120, source lines (signal lines) 150 are disposed along the column direction of the pixels 120 to cross the gate lines 140, and power supply lines (not in FIG. 12) are disposed parallel to the source lines 150. The pixels 120 are partitioned from one another by, for example, the crossing gate lines 140 and source lines 150.

The gate lines 140 are connected, on a row by row basis, to the gate electrodes of the switching transistors included in the respective pixel circuits. The source lines 150 are connected, on a column by column basis, to the source electrodes of the switching transistors. The power supply lines are connected, on a column by column basis, to the drain electrodes of the driving transistors included in the respective pixel circuits.

In FIG. 13, the pixel circuit includes the switching transistor SwTr, the driving transistor DrTr, and a capacitor C which stores data to be displayed by a corresponding one of the pixels 120. In at least one embodiment, the switching transistor SwTr is a TFT for selecting the pixel 120, and the driving transistor DrTr is a TFT for driving the organic EL element 130.

The switching transistor SwTr includes: a gate electrode G1 connected to the gate line 140; a source electrode S1 connected to the source line 150; a drain electrode D1 connected to the capacitor C and a gate electrode G2 of a second thin film transistor DrTr; and an oxide semiconductor layer (not illustrated). When a predetermined voltage is applied to the gate line 140 and the source line 150 connected to the switching transistor SwTr, the voltage applied to the source line 150 is held as data voltage in the capacitor C.

The driving transistor DrTr includes: the gate electrode G2 connected to the drain electrode D1 of the switching transistor SwTr and the capacitor C; a drain electrode D2 connected to the power supply line 160 and the capacitor C; a source electrode S2 connected to the anode 131 of the organic EL element 130; and an oxide semiconductor layer (not illustrated). The driving transistor DrTr supplies current corresponding to data voltage held in the capacitor C from the power supply line 160 to the anode 131 of the organic EL element 130 via the source electrode S2. With this, in the organic EL element 130, drive current flows from the anode 131 to the cathode 133, which causes the EL layer 132 to emit light.

It is to be noted that the organic EL display device 100 having the above-described configuration uses an active-matrix system in which display control is performed for each pixel 120 at a cross-point between the gate line 140 and the source line 150. With this, the switching transistor SwTr and the driving transistor DrTr in each pixel 120 cause the corresponding organic EL element 130 to selectively emit light, and thus an image is displayed.

As above, the organic EL display device 100 in at least one embodiment uses, as the switching transistor SwTr and the driving transistor DrTr, the thin film transistor 1 having superior device characteristics, high reliability, and high robustness, and thus an organic EL display device having superior reliability is achieved. In particular, the thin film transistor 1 is used as the driving transistor DrTr driving the organic EL element 130, and an organic EL display device having superior display performance is achieved.

[Other Variations etc.]

As shown above, a thin film transistor and a method for manufacturing the same have been described based on the aforementioned embodiment, but the present description is not limited to above described at least one embodiment.

For example, in the above described at least one embodiment, although the annealing for diffusing fluorine from the fluorine-including layer 60 is performed right after the fluorine-including layer 60 is formed and before the gate electrode 70 is formed, the present description is not limited to this. The annealing may be performed with any timing as long as the fluorine-including layer 60 is formed prior to the annealing. In addition, another annealing may be used as the annealing for diffusing fluorine from the fluorine-including layer 60. For example, the other annealing may be annealing for stabilizing the characteristics of the oxide semiconductor layer 30.

Moreover, although the amorphous oxide semiconductor of $InGaZnO_x$ (IGZO) is used as the oxide semiconductor for use in the oxide semiconductor layer in the above described at least one embodiment, the present description is not limited to this. An oxide semiconductor including in such as a polycrystalline oxide semiconductor like InGaO can be used.

Moreover, although the top-gate TFT has been described in the above described at least one embodiment, the principle of the present description can be applied to the bottom-gate TFTs.

Moreover, the above described at least one embodiment has described the organic EL display device as the display device including the thin film transistor, but the present description is not limited to this. For example, the thin film transistor according to the above described at least one embodiment can be applied to another display device such as a liquid crystal display device.

In this case, the organic EL display device (organic EL panel) can be used as a flat panel display. For example, the organic EL display device can be used as a display panel of any electronic device such as a television set, a personal computer, and a cellular phone.

Moreover, the scope of the present description includes at least one embodiment obtained by adding various modifications to each embodiment or variation that may be conceived by those skilled in the art or an embodiment obtained by arbitrarily combining components and functions of the embodiment or variation without departing from the spirit of the present description.

Industrial Applicability

The thin film transistor according to the present decryption can be widely used in a variety of electric equipment including the thin film transistor, such as display devices (display panels) like organic EL display devices, television sets, personal computers, and cellular phones.

The invention claimed is:

1. A thin film transistor comprising:
a gate electrode, wherein the gate electrode has a first length which is a channel direction length in a first direction;
an oxide semiconductor layer which includes at least indium and is usable as a channel layer, wherein a region of the oxide semiconductor layer closest to the gate electrode includes fluorine;
a gate insulating layer between the gate electrode and the oxide semiconductor layer; and
a fluorine-including layer which includes fluorine and is between the gate electrode and the gate insulating layer, wherein the fluorine-including layer has a second length in the first direction, the first direction is parallel to the channel layer, and the first length is substantially equal to the second length.

2. The thin film transistor according to claim 1, wherein the gate insulating layer includes fluorine, and a fluorine concentration of the oxide semiconductor layer is higher than a fluorine concentration of the gate insulating layer.

3. The thin film transistor according to claim 1, wherein the fluorine-including layer is a fluorine layer consisting of fluorine.

4. The thin film transistor according to claim 1, wherein the gate insulating layer comprises an inorganic material, and
the fluorine-including layer comprises an organic material and fluorine.

5. The thin film transistor according to claim 1, wherein the fluorine-including layer and the gate insulating layer include a same material, and
a peak position of an X-ray photoelectron spectroscopy spectrum of the material in the fluorine-including layer is closer to a high binding energy side than a peak position of an X-ray photoelectron spectroscopy spectrum of the material in the gate insulating layer.

6. The thin film transistor according to claim 1, wherein in the oxide semiconductor layer, a fluorine concentration of a region closest to the gate insulating layer is higher than a fluorine concentration of a region farthest from the gate insulating layer.

7. A display comprising:
a substrate;
an oxide semiconductor layer over the substrate, wherein the oxide semiconductor layer comprises indium, the oxide semiconductor layer is usable has a channel layer, and a region of the oxide semiconductor layer farthest from the substrate includes fluorine;
a gate insulating layer over the oxide semiconductor layer;
a fluorine-including layer over the gate insulating layer, wherein the fluorine-including layer has a first length in a first direction; and
a gate electrode over the fluorine-including layer, wherein the gate electrode has a second length which is a channel direction length in the first direction, the first direction is parallel to the channel layer, and the first length is substantially equal to the second length.

8. The display according to claim 7, further comprising:
a source region on a first side of the oxide semiconductor layer; and
a drain region on a second side of the oxide semiconductor layer, wherein the first side is opposite the second side.

9. The display according to claim 8, wherein the gate insulating layer is a continuous layer extending over the oxide semiconductor layer, the source region and the drain region.

10. The display according to claim 8, wherein the fluorine-including layer is limited to an area of the gate insulating layer directly above the oxide semiconductor layer.

11. The display according to claim 8, further comprising an interlayer insulating layer over the gate insulating layer.

12. The display according to claim 11, further comprising:
- a source electrode extending through the interlayer insulating layer and the gate insulating layer to electrically connect with the source region; and
- a drain electrode extending through the interlayer insulating layer and the gate insulating layer to electrically connect with the drain region.

13. The display according to claim 7, further comprising an undercoat layer between the oxide semiconductor layer and the substrate.

14. The display according to claim 7, further comprising an organic EL element over the gate electrode.

15. The display according to claim 14, wherein the organic EL element comprises:
- an anode;
- a cathode; and
- a light emitting layer between the anode and the cathode.

16. The display according to claim 14, further comprising:
- a source region on a first side of the oxide semiconductor layer, wherein the source region is electrically connected to the organic EL element.

17. The display according to claim 16, wherein the source region directly contacts a sidewall of the oxide semiconductor layer.

* * * * *